(12) United States Patent
Zou et al.

(10) Patent No.: US 9,991,871 B2
(45) Date of Patent: Jun. 5, 2018

(54) BULK ACOUSTIC WAVE RESONATOR COMPRISING A RING

(71) Applicant: Avago Technologies General IP (Singapore) Pte. Ltd., Singapore (SG)

(72) Inventors: Qiang Zou, Fort Collins, CO (US); Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 91 days.

(21) Appl. No.: 14/526,466

(22) Filed: Oct. 28, 2014

(65) Prior Publication Data

US 2016/0126930 A1 May 5, 2016

Related U.S. Application Data

(63) Continuation-in-part of application No. 13/208,909, filed on Aug. 12, 2011, now Pat. No. 9,048,812, and a continuation-in-part of application No. 13/151,631, filed on Jun. 2, 2011, now Pat. No. 9,203,374, and a continuation-in-part of application No. 13/074,262, filed on Mar. 29, 2011, now Pat. No. 9,136,818, and (Continued)

(51) Int. Cl.
| | |
|---|---|
| *H03H 9/13* | (2006.01) |
| *H03H 9/15* | (2006.01) |
| *H01L 41/047* | (2006.01) |
| *H01L 41/053* | (2006.01) |
| *H03H 3/04* | (2006.01) |
| *H03H 9/17* | (2006.01) |
| *H03H 9/02* | (2006.01) |

(52) U.S. Cl.
CPC ............ *H03H 9/132* (2013.01); *H01L 41/047* (2013.01); *H01L 41/0533* (2013.01); *H03H 3/04* (2013.01); *H03H 9/15* (2013.01); *H03H 9/173* (2013.01); *H03H 9/175* (2013.01); *H03H 9/02118* (2013.01)

(58) Field of Classification Search
CPC .............. H01L 41/0533; H01L 41/047; H03H 9/02118; H03H 9/132; H03H 9/173; H03H 9/175; H03H 3/04; H03H 9/0211; H03H 9/15
USPC .................................................. 333/187, 189
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |

(Continued)

FOREIGN PATENT DOCUMENTS

| | | | |
|---|---|---|---|
| JP | 2003-017964 A | * | 1/2003 |
| JP | 2006-246451 | * | 9/2006 |

(Continued)

OTHER PUBLICATIONS

English language machine translation of JP 2006-246451, published Sep. 14, 2006, 16 pages.*

(Continued)

*Primary Examiner* — Barbara Summons

(57) ABSTRACT

An acoustic resonator includes a first electrode disposed over a substrate; a piezoelectric layer disposed over the first electrode; and a second electrode disposed over the piezoelectric layer; a passivation layer disposed over the second electrode; and a ring disposed between the substrate and the passivation layer.

14 Claims, 17 Drawing Sheets

Related U.S. Application Data a continuation-in-part of application No. 13/036,489, filed on Feb. 28, 2011, now Pat. No. 9,154,112.

(56) References Cited

U.S. PATENT DOCUMENTS

| | | | |
|---|---|---|---|
| 5,903,087 A | 5/1999 | Mattson et al. | |
| 6,107,721 A | 8/2000 | Lakin | |
| 6,384,697 B1 | 5/2002 | Ruby | |
| 6,507,983 B1 | 1/2003 | Ruby et al. | |
| 6,828,713 B2 | 12/2004 | Bradley et al. | |
| 6,941,036 B2 | 9/2005 | Lucero | |
| 7,161,448 B2 | 1/2007 | Feng et al. | |
| 7,199,683 B2 | 4/2007 | Thalhammer et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,388,454 B2 | 6/2008 | Ruby et al. | |
| 7,468,608 B2 | 12/2008 | Feucht et al. | |
| 7,508,286 B2 | 3/2009 | Ruby et al. | |
| 7,535,154 B2 | 5/2009 | Umeda et al. | |
| 7,561,009 B2 | 7/2009 | Larson, III et al. | |
| 7,616,079 B2 | 11/2009 | Tikka et al. | |
| 7,629,865 B2 | 12/2009 | Ruby | |
| 7,636,027 B2 * | 12/2009 | Mori | H03H 9/0211 310/334 |
| 7,714,684 B2 | 5/2010 | Ruby et al. | |
| 7,791,434 B2 | 9/2010 | Fazzio et al. | |
| 7,952,257 B2 * | 5/2011 | Iwaki | H03H 9/02118 310/320 |
| 7,966,722 B2 | 6/2011 | Hart et al. | |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,384,497 B2 | 2/2013 | Zhang | |
| 8,456,257 B1 | 6/2013 | Fattinger | |
| 8,575,820 B2 | 11/2013 | Shirakawa et al. | |
| 9,048,812 B2 | 6/2015 | Burak et al. | |
| 9,083,302 B2 | 7/2015 | Burak et al. | |
| 9,148,117 B2 | 9/2015 | Burak et al. | |
| 9,154,112 B2 | 10/2015 | Burak | |
| 9,203,374 B2 | 12/2015 | Burak et al. | |
| 9,385,684 B2 | 7/2016 | Nikkel et al. | |
| 9,401,691 B2 | 7/2016 | Zou et al. | |
| 9,401,692 B2 | 7/2016 | Burak et al. | |
| 9,425,764 B2 | 8/2016 | Burak et al. | |
| 9,444,426 B2 | 9/2016 | Burak et al. | |
| 9,461,616 B2 * | 10/2016 | Umeda | H03H 9/02015 |
| 9,484,882 B2 | 11/2016 | Burak et al. | |
| 9,525,397 B2 | 12/2016 | Burak | |
| 9,571,063 B2 | 2/2017 | Burak et al. | |
| 9,571,064 B2 | 2/2017 | Burak et al. | |
| 2006/0132262 A1 * | 6/2006 | Fazzio | H03H 9/173 333/187 |
| 2007/0205850 A1 | 9/2007 | Jamneala et al. | |
| 2008/0060181 A1 * | 3/2008 | Fazzio | H03H 9/02149 29/25.35 |
| 2008/0129414 A1 | 6/2008 | Lobl et al. | |
| 2009/0102319 A1 | 4/2009 | Nakatsuka et al. | |
| 2009/0153268 A1 | 6/2009 | Milsom et al. | |
| 2010/0033063 A1 * | 2/2010 | Nishihara | H03H 9/02118 310/365 |
| 2010/0039000 A1 | 2/2010 | Milson et al. | |
| 2010/0107389 A1 | 5/2010 | Nessler et al. | |
| 2010/0260453 A1 | 10/2010 | Block | |
| 2010/0327697 A1 | 12/2010 | Choy et al. | |
| 2010/0327994 A1 | 12/2010 | Choy et al. | |
| 2011/0148547 A1 | 6/2011 | Zhang | |
| 2011/0180391 A1 | 7/2011 | Larson, III et al. | |
| 2011/0266925 A1 | 11/2011 | Ruby et al. | |
| 2012/0177816 A1 | 7/2012 | Larson, III et al. | |
| 2012/0218055 A1 | 8/2012 | Burak et al. | |
| 2012/0226807 A1 | 9/2012 | Panella et al. | |
| 2012/0326807 A1 | 12/2012 | Choy et al. | |
| 2013/0106534 A1 | 5/2013 | Burak et al. | |

FOREIGN PATENT DOCUMENTS

| | | |
|---|---|---|
| JP | 2007-208845 | 8/2007 |
| JP | 2008-131194 | 6/2008 |
| JP | 2008-211394 | 9/2008 |
| JP | 2008-258799 A * | 10/2008 |
| WO | WO 2013/175985 A1 * | 11/2013 |

OTHER PUBLICATIONS

English language machine translation of JP 2008-258799 A, published Oct. 23, 2008, 8 pages.*
Co-pending U.S. Appl. No. 12/710,640, filed Feb. 23, 2010.
Co-pending U.S. Appl. No. 13/074,094, filed Mar. 29, 2011.
Linnell Martinez, "High confinement suspended micro-ring resonators in silicon-on-insulator," Optics Express, Jun. 26, 2006, vol. 14, No. 13, pp. 6259-6263.
Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Co-pending U.S. Appl. No. 14/191,771, filed Feb. 27, 2014.
Co-pending U.S. Appl. No. 14/192,599, filed Feb. 27, 2014.
"IEEE Xplore Abstract for Suppression of Acoustic Energy Leakage in FBARs with Al Bottom Electrode: FEM Simulation and Experimental Results", Oct. 28-31, 2007, 2 pages.
"Machine Translation of JP 2007-208845", Aug. 16, 2007, 1-9.
"Machine Translation of JP 2008-211394", Sep. 11, 2008, 1-8.
Ohara, et al., "Suppression of Acoustic Energy Leakage in FBARs with Al Bottom Electrode: FEM Simulation and Experimental Results", 2007 IEEE Ultrasonics Symposium, Oct. 28-31, 2007, 1657-1660.

* cited by examiner

BULK ACOUSTIC WAVE RESONATOR COMPRISING A RING

CROSS REFERENCE TO RELATED APPLICATIONS

This application is a continuation-in-part under 37 C.F.R. § 1.53(b) of commonly owned U.S. patent application Ser. No. 13/208,909 to Burak et al. entitled "Bulk Acoustic Wave Resonator Comprising Bridge Formed within Piezoelectric Layer," filed on Aug. 12, 2011 (now granted as U.S. Pat. No. 9,048,812), which is a continuation-in-part of commonly owned is a continuation-in-part application of commonly owned U.S. patent application Ser. No. 13/151,631 to Dariusz Burak et al., entitled "Film Bulk Acoustic Resonator Comprising a Bridge," filed on Jun. 2, 2011 (now granted as U.S. Pat. No. 9,203,374), which is a continuation-in-part application of commonly owned U.S. patent application Ser. No. 13/074,262 to Dariusz Burak et al., entitled "Stacked Acoustic Resonator Comprising a Bridge," filed on Mar. 29, 2011 (now as U.S. Pat. No. 9,136,818), which is a continuation-in-part of commonly owned U.S. patent application Ser. No. 13/036,489 to Dariusz Burak, entitled "Coupled Resonator Filter Comprising Bridge" filed on Feb. 28, 2011 (now granted as U.S. Pat. No. 9,154,112). The present application claims priority under 35 U.S.C. § 120 to U.S. patent application Ser. Nos. 13/208,909, 13/151,631, 13/074,262 and 13/036,489, the disclosures of which are hereby incorporated by reference in their entirety.

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators generally convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
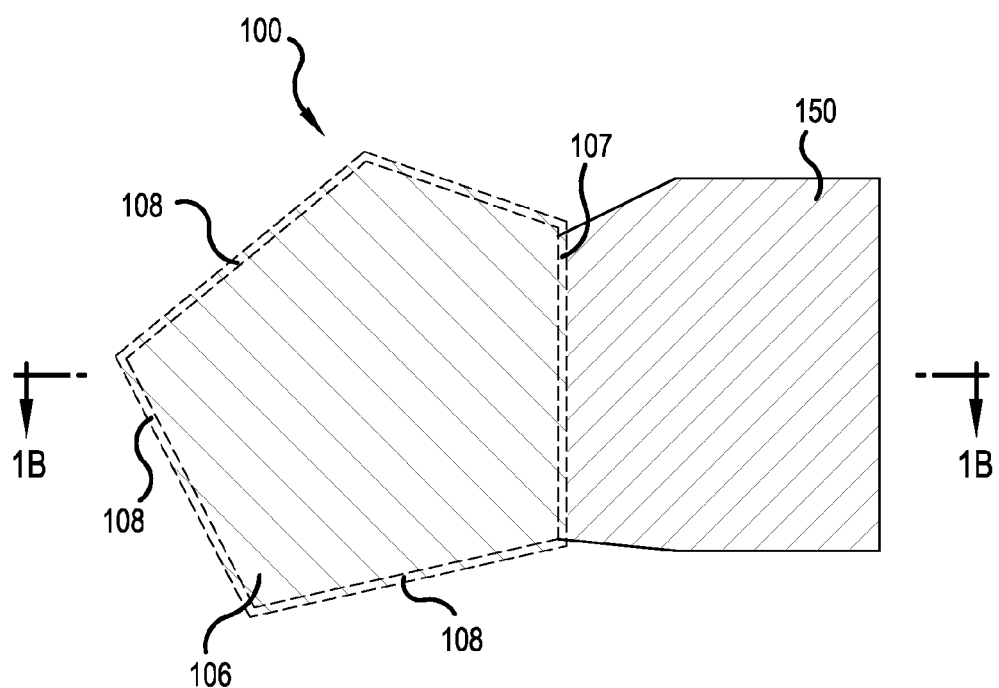
FIG. 1A is a top view illustrating a BAW resonator device according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

As used herein a "ring" refers to a combination of a "bridge" and a "cantilevered part;" or a "bridge" alone. A ring is often disposed along all sides (i.e., along the entire perimeter) of a BAW resonator device, but more generally is disposed along at least one side of a BAW resonator device.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,161, 448, 7,791,434, 8,188,810, and 8,230,562 to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Pat. No. 8,902,023 to Choy, et al.; U.S. Pat. Nos. 9,243,316 and 8,673,121 to Larson III, et al.; U.S. Pat. No. 8,981,876 to Jamneala et al.; U.S. Pat. No. 9,479,139 to Ruby, et al.: U.S. Patent Application Publication No. 20140132117 to John L. Larson III; U.S. Pat. No. 9,136,819 to Choy, et al.; U.S. Pat. No. 9,602,073 to Choy, et al.; U.S. Pat. No. 9,455,681 to Feng, et al.; and U.S. Pat. No. 9,571,064 to Burak, et al. The entire disclosure of each of the patents, published patent applications and patent application listed above are hereby specifically incorporated by reference herein. It is emphasized that the components, materials and method of fabrication described in these patents and patent applications are representative and other methods of fabrication and materials within the purview of one of ordinary skill in the art are also contemplated.

According to various embodiments, FIG. 1A is a top view of a BAW resonator device 100 in accordance with a representative embodiment. From FIG. 1A, a planarization layer 104 can be seen disposed over an electrode (i.e., second electrode 106—not shown in FIG. 1A). The BAW resonator device 100 of FIG. 1A also features a bridge 107 (sometimes referred to below as first bridge 107), and a cantilevered portion 108. The cantilevered portion 108 is depicted on all sides of the BAW resonator device 100, excepting the side comprising the bridge 107, at a connection side 150. As described more fully below, in accordance with a representative embodiment, in combination, the bridge 107 and the cantilevered portion 108 may be referred to as a ring. In other representative embodiments, a bridge alone may be referred to as a ring.

Figure 1B:
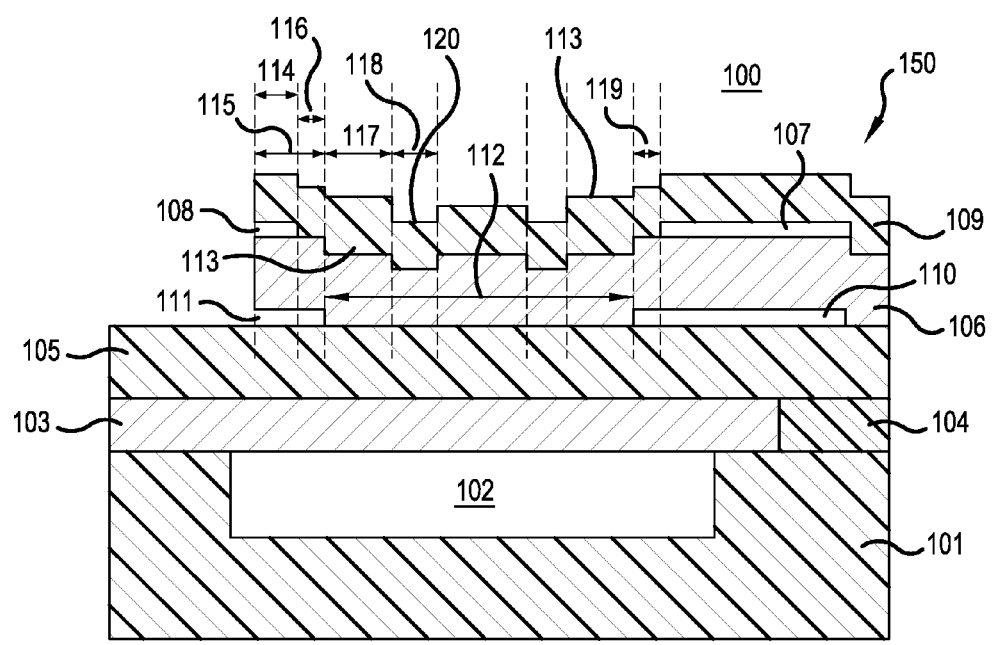
FIG. 1B is a cross-sectional diagram illustrating a BAW resonator device according to a representative embodiment.

According to various embodiments, FIG. 1B is a cross-sectional view of BAW resonator device 100, which includes a ring, according to a representative embodiment.

Referring to FIG. 1B, illustrative BAW resonator device 100 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (not shown in FIG. 1B), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The piezoelectric layer 105 is formed over the first electrode 103 and the planarization layer 104.

A planarization layer 104 is provided over the substrate 101, beneath the piezoelectric layer 105, and abutting a termination of the first electrode 103. In certain embodiments described below, the planarization layer 104 extends over the cavity 102, causing the termination of the first electrode 103 to occur over the cavity 102. Notably, the planarization layer 104 is optional, but its presence can accord various benefits. For instance, the presence of the planarization layer 104 tends to improve the structural stability of BAW resonator device 100, may improve the quality of growth of subsequent layers (e.g., the piezoelectric layer 105), and may allow first electrode 103 to be formed without its edges extending beyond the cavity 102. Further examples of potential benefits of planarization are presented in U.S. Pat. No. 9,525,399 to Burak et al., which is hereby incorporated by reference in its entirety.

A second electrode 106 is provided over the piezoelectric layer 105. The acoustic stack comprises a first electrode 103, a piezoelectric layer 105 and a second electrode 106. As is known, a contacting overlap of the first electrode 103, the piezoelectric layer 105 and the second electrode 106 over the cavity 102, or other acoustic reflector such as a distributed Bragg reflector (not shown in FIG. 1B) forms the active region of the BAW resonator device 100.

A passivation layer 109 is disposed over the second electrode 106. The passivation layer 109 comprises a first bridge 107 disposed on the connection side of the BAW resonator device 100. The passivation layer 109 also comprises a first cantilevered portion 108 (also known as a wing) disposed along one side, if not all sides exception the connection side of the passivation layer 109. In combination, herein, the first bridge 107 and the first cantilevered portion 108 may be referred to as a first ring.

The second electrode 106 may be connected on connection side that comprises a second bridge 110. The second electrode 106 also comprises a second cantilevered portion 111 (also known as a wing) disposed along at least one side, if not all sides exception the connection side of the second electrode 106. In combination, herein, the second bridge 110 and the second cantilevered portion 111 may be referred to as a second ring. The second cantilevered portion 111 is described, for example, in U.S. Patent Application 20120326807 and the second bridge 110 is described, for example, in U.S. Pat. No. 8,248,185 referenced above.

The BAW resonator device 100 also comprises a recessed frame element 120 (sometimes referred to as an "innie") and raised frame element 113 (sometimes referred to as an "outie"). The outer edges of the raised frame element 113 define the active region 112 of BAW resonator device 100. As is known, recessed frame element 120 and raised frame element 113 provide an acoustic impedance mismatch that serves to foster reflections of acoustic waves back into active region of the BAW resonator device 100, reducing lost acoustic energy and improving the Q-factor of the BAW resonator device.

As depicted in FIG. 1B, the first cantilevered portion 108 has a width 114; the second cantilevered portion 111 has a width 115; the passivation layer 109 overlaps the second cantilevered portion 111 by a distance 116 (notably, distance 116 depicts the offset of the first and second cantilevered portions 108, 111); the raised frame element 113 has a width 117; the recessed frame element 120 has a width 118; and the passivation layer 109 overlaps the second bridge 110 by a distance 119 (notably, notably, distance 119 depicts the offset of the first and second bridges 107, 110). Generally, and as will be appreciated by one of ordinary skill in the art, the widths 114, 115, 117 and distance 119 are selected to optimize the performance of the BAW resonator device 100, such as the Q factor. Notably, there are typically four propagating longitudinal modes of interest that are supported by the BAW resonator device 100 for driving electric field frequencies above the series resonance frequency Fs. Generally, the widths 114, 115, 117 and distances 116, 119 are selected to suppress excitation of propagating modes that may exist in the region between the edge of the second electrode and the outer edge of the cavity 102 (depicted by distance 116) and to suppress excitation of propagating modes that may exist in the active region 112 of the BAW resonator device 100. As should be appreciated by one skilled in the art, combined these modes lead to radiative, viscous and Joule heating energy losses and therefore lower quality factor Q of the BAW resonator device 100. Typically, the width 114, the width 115 and the width 117 may range from 0 um to approximately 10 um. The distance 116 is a difference between the width 115 and the width 114 and there may also range from 0 μm to approximately 10 μm.

Additionally, and as described more fully below, it has been found that certain improvements in the series resistance ($R_S$) at series resonance frequency ($F_S$) are realized by providing the first bridge 107, the first cantilevered portion 108, and by the offsetting overlap (distance 116) of the first and second cantilevered portions 108, 111.

The substrate 101 may be formed of various types of semiconductor materials compatible with semiconductor processes, such as silicon (Si), gallium arsenide (GaAs), indium phosphide (InP), or the like, which is useful for integrating connections and electronics, thus reducing size and cost.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

The planarization layer 104 illustratively comprises non-etchable borosilicate glass (NEBSG), for example, or other similar material that is compatible with the function of the BAW resonator device 100, and withstands the processing steps to form the BAW resonator device 100. In certain embodiments, planarization layer 104 does not need to be present in the structure (as it increases overall processing cost), but when present, it may improve quality of growth of subsequent layers and simplify their processing.

The piezoelectric layer 105 may be formed of a thin film piezoelectric compatible with semiconductor processes, such as aluminum nitride (AlN), zinc oxide (ZnO), lead zirconium titanate (PZT), or the like. The piezoelectric layer 105 may be doped with Scandium, or other rare-earth element as described above in certain referenced applications. The thickness of the piezoelectric layer 105 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 105 may be formed on a seed layer (not shown) disposed over an upper surface the first electrode 103. For example, the seed layer may be formed of Al to foster growth of an AlN piezoelectric layer 105. The seed layer may have a thickness in the range of about 50 Å to about 5000 Å, for example.

The second electrode 106 is formed over the piezoelectric layer 105. The second electrode 106 is formed of an electrically conductive material compatible with semiconductor processes, such as Mo, W, Al, Pt, Ru, Nb, Hf, Cu, or the like. In an embodiment, the second electrode 106 is formed of the same material as the first electrode 103. However, in various embodiments, the second electrode 106 may be formed of a different material than the second electrode 106, without departing from the scope of the present teachings.

The passivation layer 109 may be formed of various types of materials, including AlN, silicon carbide (SiC), BSG, $SiO_2$, SiN, polysilicon, and the like. Generally, the thickness of the passivation layer 109 must be sufficient to insulate all layers of the acoustic stack from the environment, including protection from moisture, corrosives, contaminants, debris and the like. The first and second electrodes 103, 106 are electrically connected to external circuitry via contact pads (not shown), which may be formed of an electrically conductive material, such as gold, gold-tin alloy or the like.

Figure 1C:
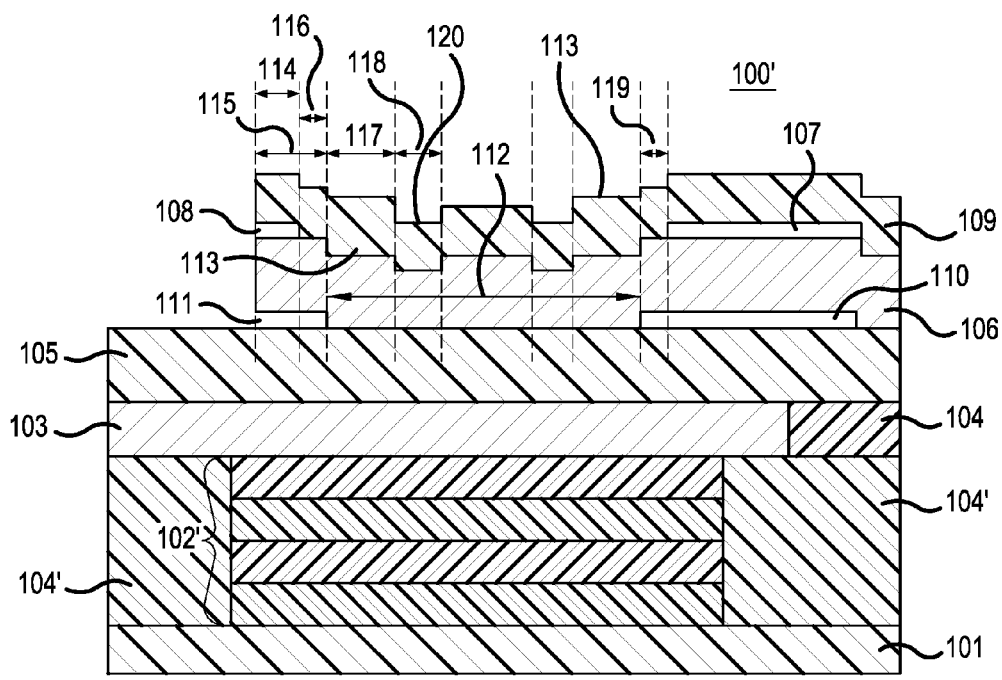
FIG. 1C is a cross-sectional diagram illustrating a BAW resonator device according to a representative embodiment.

According to various embodiments, FIG. 1C is a cross-sectional view of BAW resonator device 100', which includes a ring comprising a bridge and a cantilevered portion, according to a representative embodiment. Many details of the BAW resonator device 100 are common to those of BAW resonator device 100'. Often, these details may not be repeated in order to avoid obscuring the description of the presently described representative embodiments.

Referring to FIG. 1C, illustrative BAW resonator device 100' includes acoustic stack formed over a substrate 101. In the depicted embodiment, the substrate 101 comprises a an acoustic reflector 102', such as a Distributed Bragg Reflector, having alternating layers of low and high acoustic impedance materials, formed in the substrate 101. An acoustic reflector may be fabricated according to various techniques, an example of which is described in U.S. Pat. No. 7,358,831 to Larson, III, et al., which is hereby incorporated by reference.

A planarization layer 104' is provided over the substrate 101, beneath the piezoelectric layer 105, on each side of the acoustic reflector 102', and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the acoustic reflector 102' forms the active region of the BAW resonator device 100'.

The passivation layer 109 is disposed over the second electrode 106. The passivation layer 109 comprises first bridge 107 disposed on the connection side of the BAW resonator device 100. The passivation layer 109 also comprises first cantilevered portion 108 (also known as a wing) disposed along one side, if not all sides exception the connection side of the passivation layer 109. In combination, herein, the first bridge 107 and the first cantilevered portion 108 may be referred to as a first ring.

The second electrode 106 may be connected on connection side that comprises the second bridge 110. The second electrode 106 also comprises the second cantilevered portion 111 (also known as a wing) disposed along at least one side, if not all sides exception the connection side of the second electrode 106. In combination, herein, the second bridge 110 and the second cantilevered portion 111 may be referred to as a second ring. The second cantilevered portion 111 is described, for example, in U.S. Patent Application 20120326807 and the second bridge 110 is described, for example, in U.S. Pat. No. 8,248,185 referenced above.

The BAW resonator device 100' also comprises recessed frame element 120 (sometimes referred to as an "innie") and raised frame element 113 (sometimes referred to as an "outie"). As is known, recessed frame element 120 and raised frame element 113 provide an acoustic impedance mismatch that serves to foster reflections of acoustic waves back into active region of the BAW resonator device 100', reducing lost acoustic energy and improving the Q-factor of the BAW resonator device.

As depicted in FIG. 1C, the first cantilevered portion 108 has width 114; the second cantilevered portion 111 has width 115; the passivation layer 109 overlaps the second cantilevered portion 111 by distance 116 (notably, distance 116 depicts the offset of the first and second cantilevered portions 108, 111); the raised frame element 113 has width 117; the active region of BAW resonator device 100' has width 118; and the passivation layer 109 overlaps the second bridge 110 by distance 119 (notably, distance 119 depicts the offset of the first and second bridges 107, 110). Generally, and as will be appreciated by one of ordinary skill in the art, the widths 114, 115, 117 and 118 are selected to optimize the performance of the BAW resonator device 100', such as the Q factor. Notably, there are typically four dominant propagating longitudinal modes of interest that are supported by the BAW resonator device 100' for driving electric field frequencies above the series resonance frequency Fs. Generally, the widths 114, 115, 117 and distances 116, 119 are selected to suppress excitation of propagating modes that may exist in the region between the second electrode edge and the outer edge of the cavity 102 (distance 116) and to suppress excitation of propagating modes that may exist in the active region 112 of the BAW resonator device 100'. As should be appreciated by one skilled in the art, combined these modes lead to radiative, viscous and Joule heating energy losses and therefore lower quality factor Q of the BAW resonator device 100. Typically, the width 114, the width 115 and the width 117 may range from 0 µm to approximately 10 µm. The distance 116 is a difference between the width 115 and the width 114 and there may also range from 0 µm to approximately 10 µm.

Additionally, and as described more fully below, it has been found that certain improvements in the series resistance ($R_S$) at series resonance frequency ($F_S$) are realized by providing the first bridge 107, the first cantilevered portion 108, and by the offsetting overlap (distance 116) of the first and second cantilevered portions 108, 111.

Figure 1D:
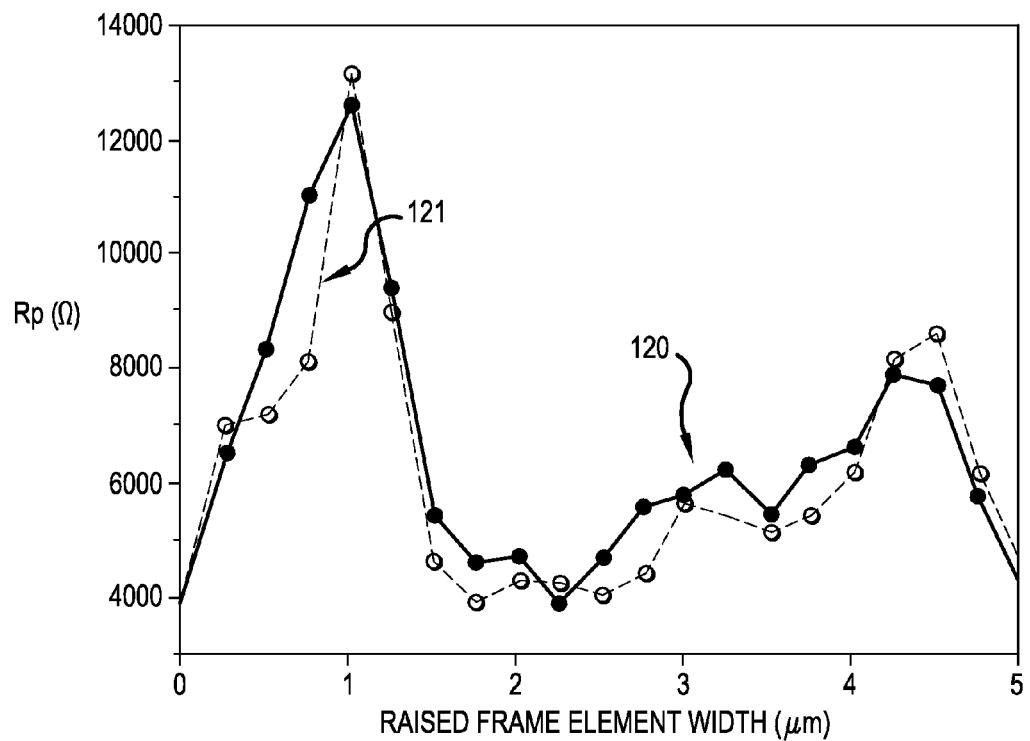
FIG. 1D is a graph of resistance at parallel resonance versus width of a raised frame element.

FIG. 1D is a graph of simulated parallel resistance ($R_P$) at parallel resonance frequency ($R_P$) versus width of a raised frame element. Notably, curve 121 depicts $R_P$ of a known BAW resonator device comprising a bridge and a cantilevered portion in a second electrode, whereas curve 122 depicts $R_P$ of BAW resonator device 100 of FIG. 1B with distance 116 set at approximately 1.75 µm. Illustratively, both BAW resonator devices comprised the first electrode 103 formed of Mo approximately 3100 Å thick, the piezoelectric layer 105 formed of AlN approximately 5000 Å thick, the second electrode formed of Mo approximately 3000 Å thick, and the passivation layer formed of AlN approximately 2400 Å thick. Notably, the recessed frame element 120 had been skipped in the simulations, and the raised frame element 113 is formed of Mo approximately 1000 Å thick. As can be appreciated, $R_p$ is generally the same for both BAW resonator devices. As expected, $R_p$ is as periodic function of the raised frame element with the period of approximately 3 µm.

Figure 1E:
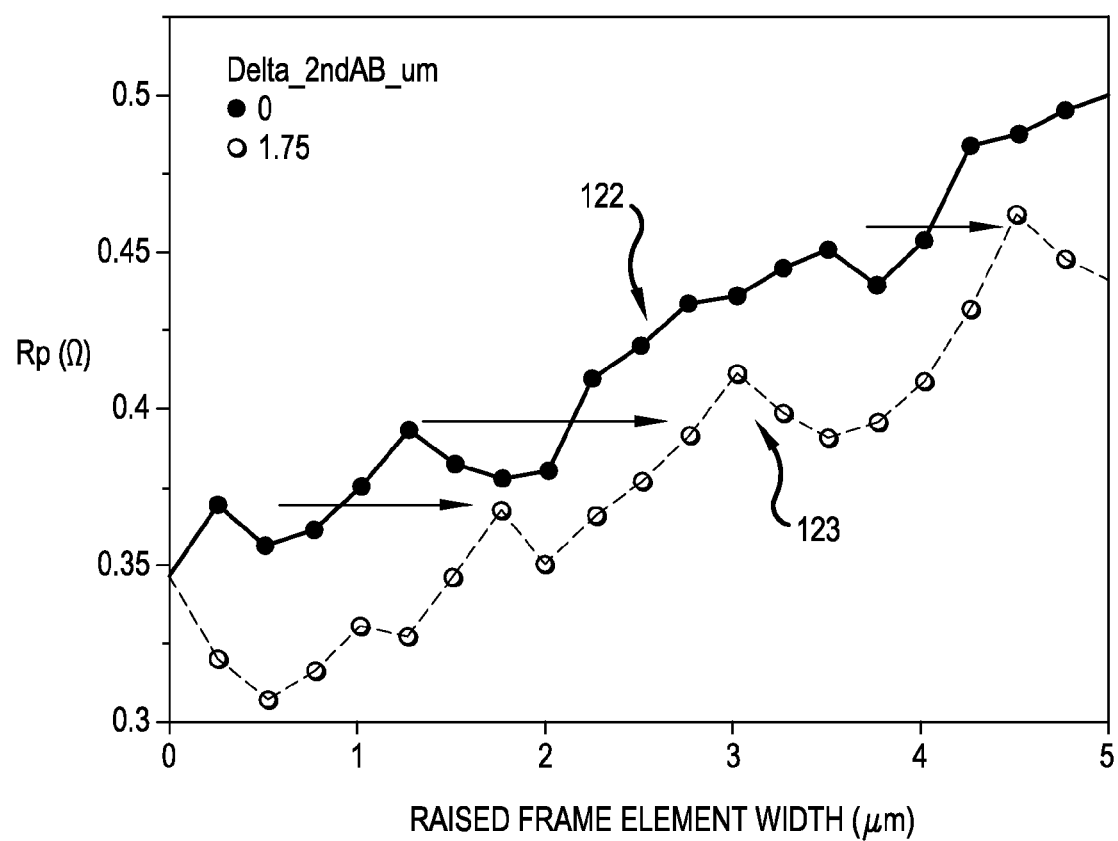
FIG. 1E is a graph of resistance at series resonance versus width of a raised frame element.

FIG. 1E is a graph of simulated series resistance (s) at series resonance frequency ($F_S$) versus width of a raised frame element. Notably, curve 122 depicts $R_S$ of a known BAW resonator device comprising a bridge and a cantilevered portion in a second electrode, whereas curve 123 depicts $R_s$ of BAW resonator device 100 of FIG. 1B with distance 116 set at approximately 1.75 µm. As can be appreciated, $R_S$ is generally lower for BAW resonator device 100 as compared to the known BAW resonator device. As is known, it is desirable to minimize $R_S$ to the extent practical with minimized impact on $R_P$. As FIG. 1E demonstrates, in the illustrative example, lower $R_S$ can be achieved by selecting the distance 116 of the first cantilevered portion 108 to approximately 1.75 µm.

Figure 2A:
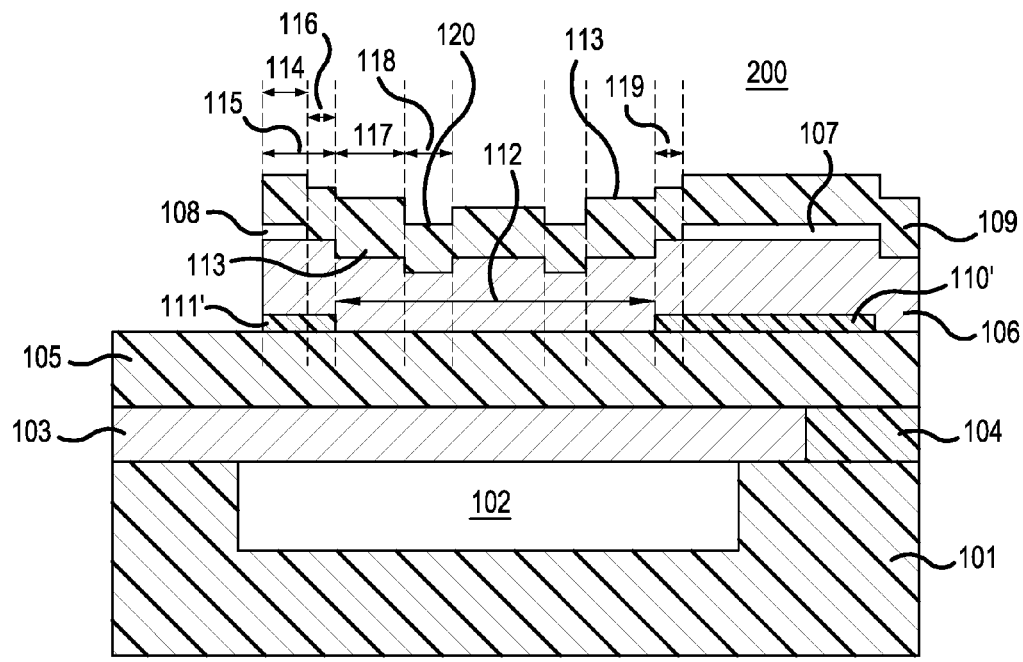
FIGS. 2A-2C are cross-sectional diagrams illustrating BAW resonator devices according to representative embodiments.

According to various embodiments, FIG. 2A is a cross-sectional view of BAW resonator device 200, which includes a ring comprising a bridge and a cantilevered portion, according to a representative embodiment. Many details of the BAW resonator device 200 are common to those of BAW resonator devices 100, 100'. Often, these details may not be repeated in order to avoid obscuring the description of the presently described representative embodiments.

Referring to FIG. 2A, illustrative BAW resonator device 200 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 200.

The passivation layer 109 is disposed over the second electrode 106. The passivation layer 109 comprises first bridge 107 disposed on the connection side of the BAW resonator device 100. The passivation layer 109 also comprises first cantilevered portion 108 (also known as a wing) disposed along one side, if not all sides exception the connection side of the passivation layer 109. In combination, herein, the first bridge 107 and the first cantilevered portion 108 may be referred to as a first ring.

The second electrode 106 may be connected on connection side that comprises a filled second bridge 110'. The second electrode 106 also comprises a filled second cantilevered portion 111' (also known as a filled wing) disposed along at least one side, if not all sides exception the connection side of the second electrode 106. In combination, herein, the filled second bridge 110' and the filled second cantilevered portion 111' may be referred to as a filled second ring. The filled second cantilevered portion 111' is described, for example, in U.S. Patent Application 20120326807 and the filled second bridge 110' is described, for example, in U.S. Pat. No. 8,248,185 referenced above.

In the depicted embodiment, the filled second bridge 110' and the filled second cantilevered portion 111' are filled with a dielectric material. The dielectric material is selected for its acoustic properties and for its ability to withstand processing steps used to fabricate the BAW resonator device 200. Notably, the dielectric material has an acoustic impedance in order to provide significantly large lateral acoustic impedance discontinuity at the boundary of the active region of BAW resonator device 200. The mechanism of reducing losses in the filled second bridge 110' relies on suppression and confinement of the propagating eigenmodes which are mechanically excited at the perimeter of the active region of the BAW resonator device 200 as a part of piston mode excitation. Both ends of the filled second bridge 110' provide mechanical discontinuities to control the phase of the reflected mode and to provide overall beneficial suppression of the propagating eigenmodes in the active region.

The dielectric material used to fill the filled second bridge 110' and the filled second cantilevered portion 111' is selected to survive etching steps used to form various features of the BAW resonator device 200, such as the cavity 102, the first bridge 107, and the first cantilevered portion 108. Illustratively, the dielectric material used to fill the filled second bridge 110' and the filled second cantilevered portion 111' comprises one of non-etchable borosilicate glass (NEBSG), carbon doped silicon dioxide (CDO), or silicon carbide (SiC).

Figure 2B:
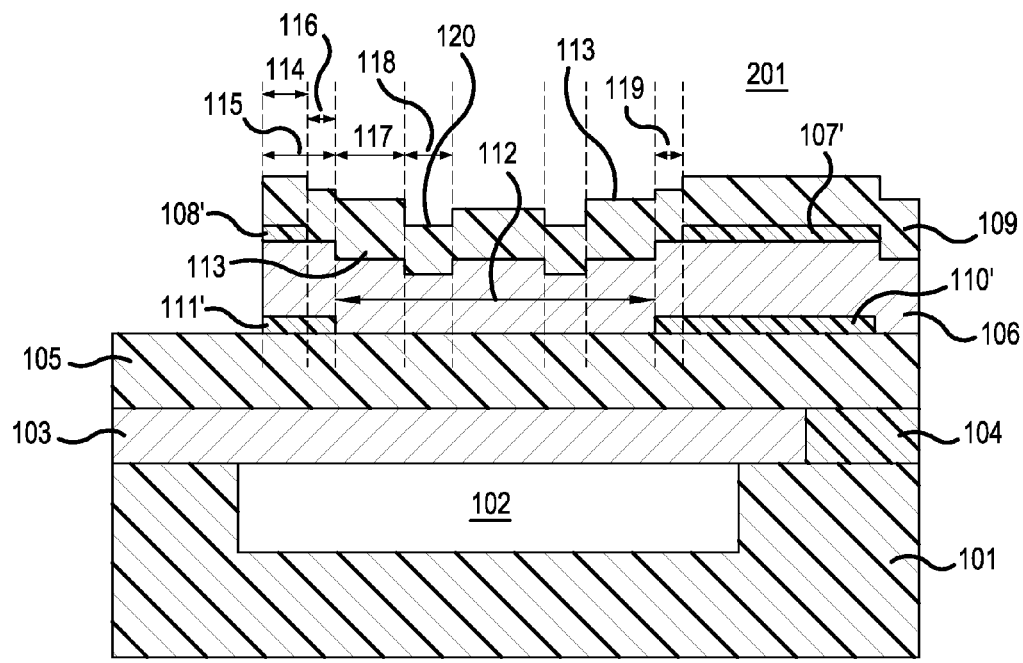

According to various embodiments, FIG. 2B is a cross-sectional view of BAW resonator device 201, which includes a ring comprising a bridge and a cantilevered portion, according to a representative embodiment. Many details of the BAW resonator device 201 are common to those of BAW resonator devices 100, 100', 201. Often, these details may not be repeated in order to avoid obscuring the description of the presently described representative embodiments.

Referring to FIG. 2B, illustrative BAW resonator device 201 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

The passivation layer 109 is disposed over the second electrode 106. The passivation layer 109 comprises a filled first bridge 107' disposed on the connection side of the BAW resonator device 100. The passivation layer 109 also comprises a filled first cantilevered portion 108' (also known as a filled wing) disposed along one side, if not all sides exception the connection side of the passivation layer 109. In combination, herein, the filled first bridge 107' and the filled first cantilevered portion 108' may be referred to as a filled first ring.

The second electrode 106 may be connected on connection side that comprises filled second bridge 110'. The second electrode 106 also comprises filled second cantilevered portion 111' (also known as a filled wing) disposed along at least one side, if not all sides exception the connection side of the second electrode 106. In combination, herein, the filled second bridge 110' and the filled second cantilevered portion 111' may be referred to as filled second ring.

The dielectric material used to fill the filled first bridge 107', filled second bridge 110', filled second bridge 110', and the filled second cantilevered portion 111' is selected to survive etching steps used to form various features of the BAW resonator device 201, such as the cavity 102. Illustratively, the dielectric material used to fill the filled first bridge 107', filled second bridge 110', filled first cantilevered portion 108', and the filled second cantilevered portion 111' comprises one of non-etchable borosilicate glass (NEBSG), carbon doped silicon dioxide (CDO), or silicon carbide (SiC). As noted above, the dielectric material is selected for its acoustic properties and for its ability to withstand processing steps used to fabricate the BAW resonator device 201. Notably, the dielectric material has an acoustic impedance in order to provide significantly large lateral acoustic impedance discontinuity at the boundary of the active region of BAW resonator device 200. The mechanism of reducing losses in filled first bridge 107' and filled second bridge 110' relies on suppression and confinement of the propagating eigenmodes which are mechanically excited at the perimeter of the active region of the BAW resonator device 201 as a part of piston mode excitation. Both ends of each of the filled first bridge 107' and the filled second bridge 110' provide mechanical discontinuities to control the phase of the reflected mode and to provide overall beneficial suppression of the propagating eigenmodes in the active region.

According to various embodiments, FIG. 2B is a cross-sectional view of BAW resonator device 201, which includes a ring comprising a bridge and a cantilevered portion, according to a representative embodiment. Many details of the BAW resonator device 201 are common to those of BAW resonator devices 100, 100', 200. Often, these details may not be repeated in order to avoid obscuring the description of the presently described representative embodiments.

Figure 2C:
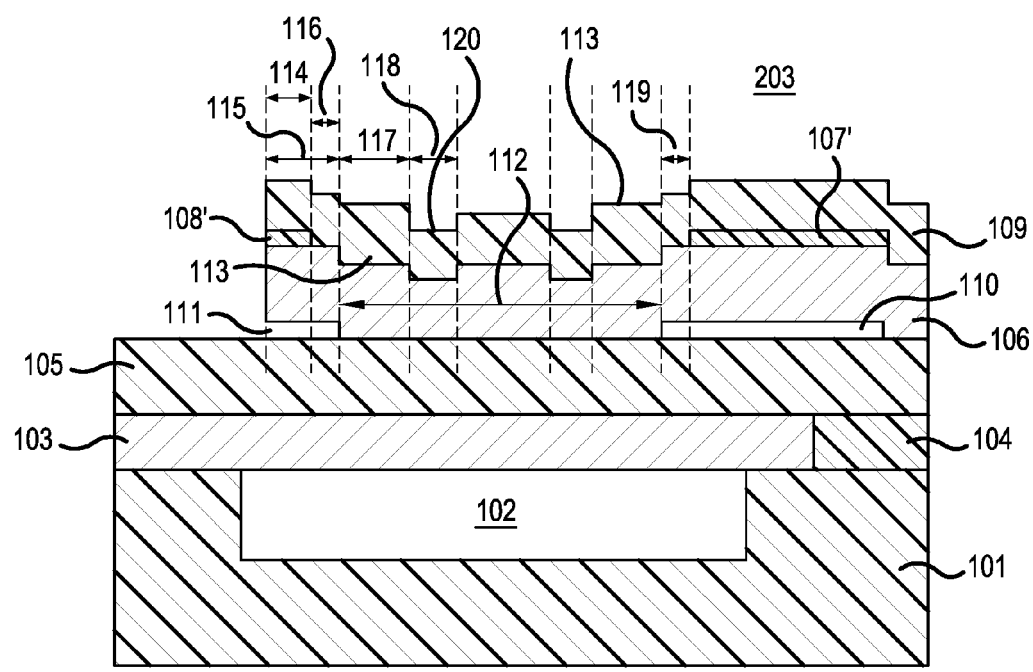

Referring to FIG. 2C, illustrative BAW resonator device 203 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

The passivation layer 109 is disposed over the second electrode 106. The passivation layer 109 comprises a filled first bridge 107' disposed on the connection side of the BAW resonator device 100. The passivation layer 109 also comprises a filled first cantilevered portion 108' (also known as a filled wing) disposed along one side, if not all sides exception the connection side of the passivation layer 109. In combination, herein, the filled first bridge 107' and the filled first cantilevered portion 108' may be referred to as a filled first ring.

The second electrode 106 may be connected on connection side that comprises second bridge 110. The second electrode 106 also comprises second cantilevered portion 111 (also known as a wing) disposed along at least one side, if not all sides exception the connection side of the second electrode 106. In combination, herein, the second bridge 110 and the second cantilevered portion 111 may be referred to as the second ring.

The dielectric material used to fill the filled first bridge 107', filled second bridge 110' is selected to survive etching steps used to form various features of the BAW resonator device 203, such as the cavity 102, second bridge, and the second cantilevered portion 111. Illustratively, the dielectric material used to fill the filled first bridge 107', filled second bridge 110' comprises one of non-etchable borosilicate glass (NEBSG), carbon doped silicon dioxide (CDO), or silicon carbide (SiC). As noted above, the dielectric material is selected for its acoustic properties and for its ability to withstand processing steps used to fabricate the BAW resonator device 203. Notably, the dielectric material has an acoustic impedance in order to provide significantly large lateral acoustic impedance discontinuity at the boundary of the active region of BAW resonator device 203. The mechanism of reducing losses in filled first bridge 107' relies on suppression and confinement of the propagating eigenmodes which are mechanically excited at the perimeter of the active region of the BAW resonator device 203 as a part of piston mode excitation. Both ends of the first filled bridge 107' provide mechanical discontinuities to control the phase of the reflected mode and to provide overall beneficial suppression of the propagating eigenmodes in the active region.

Figure 3A:
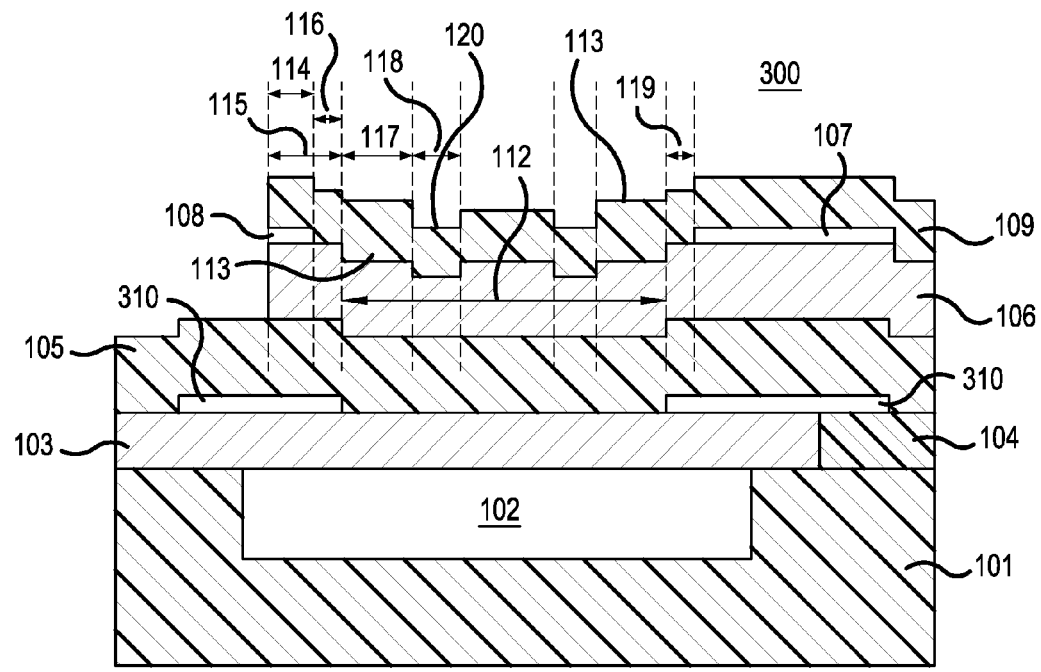
FIGS. 3A-3D are cross-sectional diagrams illustrating BAW resonator devices according to representative embodiments.

According to various embodiments, FIG. 3A is a cross-sectional view of BAW resonator device 300, which includes a ring comprising a bridge and a cantilevered portion, and a bridge alone, according to a representative embodiment. Many details of the BAW resonator device 300 are common to those of BAW resonator devices 100, 100' and 200~203. Often, these details may not be repeated in order to avoid obscuring the description of the presently described representative embodiments.

Referring to FIG. 3A, illustrative BAW resonator device 300 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 300.

The passivation layer 109 is disposed over the second electrode 106. The passivation layer 109 comprises first bridge 107 disposed on the connection side of the BAW resonator device 100. The passivation layer 109 also comprises first cantilevered portion 108 (also known as a wing) disposed along one side, if not all sides exception the connection side of the passivation layer 109. In combination, herein, the first bridge 107 and the first cantilevered portion 108 may be referred to as a first ring.

The piezoelectric layer 105 is disposed over a second bridge 310, the first electrode 103 and the planarization layer 104. The second bridge 310 is filled with air, and is disposed along at least one side, if not all sides of the piezoelectric layer 105. Notably, the second bridge 310 may be referred to as a second ring.

Figure 3B:
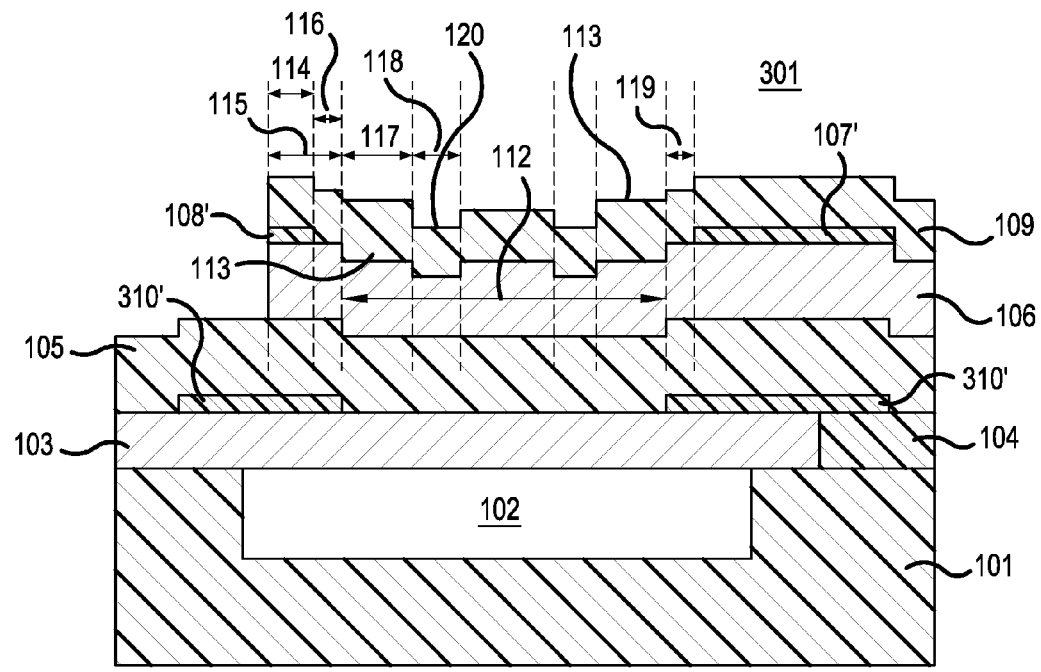

According to various embodiments, FIG. 3B is a cross-sectional view of BAW resonator device 301, which includes a ring, which includes a ring comprising a bridge and a cantilevered portion, and a bridge alone, according to a representative embodiment. Many details of the BAW resonator device 301 are common to those of BAW resonator devices 100, 100', 200~203, and 300. Often, these details may not be repeated in order to avoid obscuring the description of the presently described representative embodiments.

Referring to FIG. 3B, illustrative BAW resonator device 301 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 301.

The passivation layer 109 is disposed over the second electrode 106. The passivation layer 109 comprises filled first bridge 107' disposed on the connection side of the BAW resonator device 301. The passivation layer 109 also comprises filled first cantilevered portion 108' (also known as a filled wing) disposed along one side, if not all sides exception the connection side of the passivation layer 109. In combination, herein, the filled first bridge 107' and the filled first cantilevered portion 108' may be referred to as a filled first ring.

The piezoelectric layer 105 is disposed over a filled second bridge 310', the first electrode 103 and the planarization layer 104. The filled second bridge 310' is disposed along at least one side, if not all sides of the piezoelectric layer 105. The filled second bridge 310' may be referred to as a filled second ring.

In the depicted embodiment, the filled first bridge 107', the filled first cantilevered portion 108' and the filled second bridge 310' are filled with a dielectric material. The dielectric material is selected for its acoustic properties and for its ability to withstand processing steps used to fabricate the BAW resonator device 301. Notably, the dielectric material has an acoustic impedance in order to provide significantly large lateral acoustic impedance discontinuity at the boundary of the active region of BAW resonator device 301. The mechanism of reducing losses in the filled first bridge 107', the filled first cantilevered portion 108' and the filled second bridge 310' relies on suppression and confinement of the propagating eigenmodes which are mechanically excited at the perimeter of the active region of the BAW resonator device 301 as a part of piston mode excitation. Both ends of each of the filled first bridge 107' and the filled second bridge 310' provide mechanical discontinuities to control the phase of the reflected mode and to provide overall beneficial suppression of the propagating eigenmodes in the active region.

The dielectric material used to fill the filled first bridge 107', the filled first cantilevered portion 108' and the filled second bridge 310' is selected to survive etching steps used to form various features of the BAW resonator device 301, such as the cavity 102. Illustratively, the dielectric material used to fill the filled second bridge 310' comprises one of non-etchable borosilicate glass (NEBSG), carbon doped silicon dioxide (CDO), or silicon carbide (SiC).

Figure 3C:
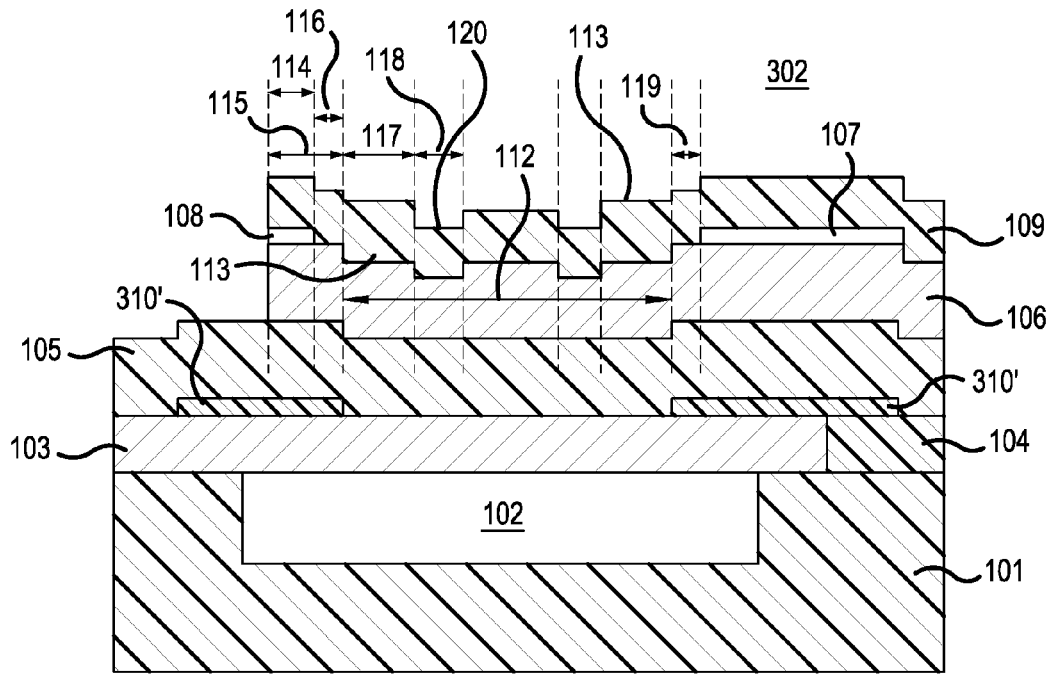

According to various embodiments, FIG. 3C is a cross-sectional view of BAW resonator device 302, which includes a ring comprising a bridge and a cantilevered portion, and a bridge alone, according to a representative embodiment. Many details of the BAW resonator device 302 are common to those of BAW resonator devices 100, 100', 200~203, 300, and 301. Often, these details may not be repeated in order to avoid obscuring the description of the presently described representative embodiments.

Referring to FIG. 3C, illustrative BAW resonator device 302 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 302.

The passivation layer 109 is disposed over the second electrode 106. The passivation layer 109 comprises first bridge 107 disposed on the connection side of the BAW resonator device 302. The passivation layer 109 also comprises first cantilevered portion 108 (also known as a wing) disposed along one side, if not all sides exception the connection side of the passivation layer 109. In combination, herein, the first bridge 107 and the filled first cantilevered portion 108' may be referred to as a first ring.

The piezoelectric layer 105 is disposed over a filled second bridge 310', the first electrode 103 and the planarization layer 104. The filled second bridge 310' is disposed along at least one side, if not all sides of the piezoelectric layer 105. The filled second bridge 310' may be referred to as a filled second ring.

In the depicted embodiment, the filled second bridge 310' is filled with a dielectric material. The dielectric material is selected for its acoustic properties and for its ability to withstand processing steps used to fabricate the BAW resonator device 302. Notably, the dielectric material has an acoustic impedance in order to provide significantly large lateral acoustic impedance discontinuity at the boundary of the active region of BAW resonator device 302. The mechanism of reducing losses in the filled second bridge 310' relies on suppression and confinement of the propagating eigenmodes which are mechanically excited at the perimeter of the active region of the BAW resonator device 302 as a part of piston mode excitation. Both ends of the filled second bridge 310' provide mechanical discontinuities to control the phase of the reflected mode and to provide overall beneficial suppression of the propagating eigenmodes in the active region.

The dielectric material used to fill the filled second bridge 310' is selected to survive etching steps used to form various features of the BAW resonator device 302, such as the cavity 102, the first bridge 107, and the first cantilevered portion 108. Illustratively, the dielectric material used to fill the filled second bridge 110' and the filled second cantilevered portion 111' comprises one of non-etchable borosilicate glass (NEBSG), carbon doped silicon dioxide (CDO), or silicon carbide (SiC).

Figure 3D:
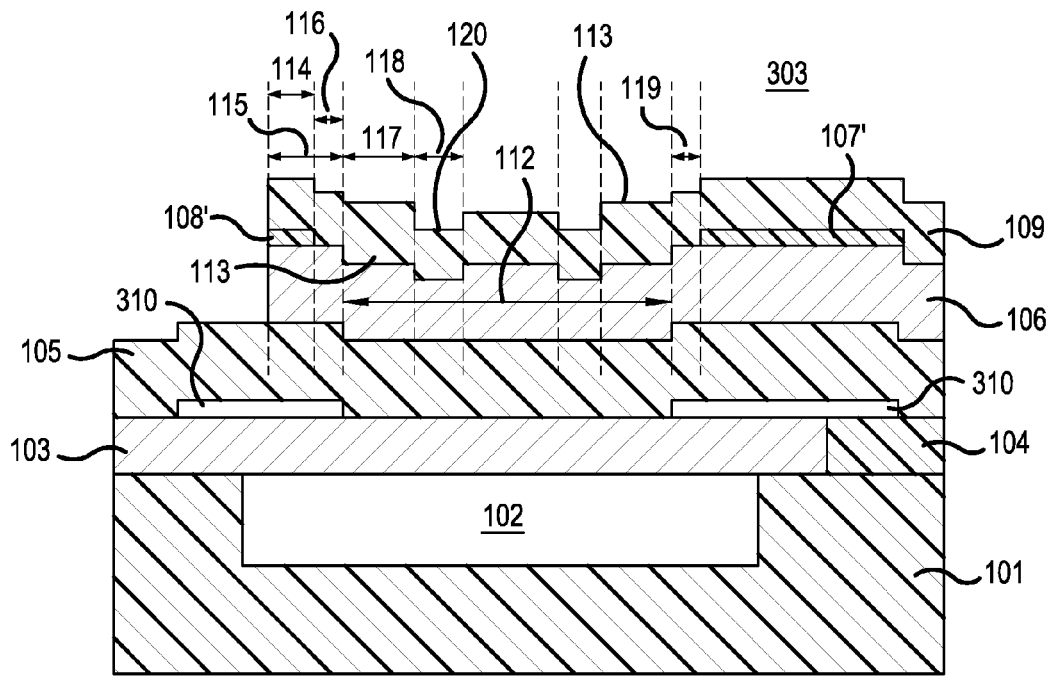

According to various embodiments, FIG. 3D is a cross-sectional view of BAW resonator device 303, which includes a ring comprising a bridge and a cantilevered portion, and a bridge alone, according to a representative embodiment. Many details of the BAW resonator device 303 are common to those of BAW resonator devices 100, 100', 200~203, and 300~302. Often, these details may not be repeated in order to avoid obscuring the description of the presently described representative embodiments.

Referring to FIG. 3D, illustrative BAW resonator device 303 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 303.

The passivation layer 109 is disposed over the second electrode 106. The passivation layer 109 comprises filled first bridge 107' disposed on the connection side of the BAW resonator device 100. The passivation layer 109 also comprises filled first cantilevered portion 108' (also known as a filled wing) disposed along one side, if not all sides exception the connection side of the passivation layer 109. In combination, herein, the filled first bridge 107' and the filled first cantilevered portion 108' may be referred to as a filled first ring.

The piezoelectric layer 105 is deposited over the second bridge 310, the first electrode 103 and the planarization layer 104. The second bridge 310 is disposed along at least one side, if not all sides of the piezoelectric layer 105. The second bridge 310 may be referred to as a second ring.

In the depicted embodiment, the filled first bridge 107' and the filled first cantilevered portion 108' are filled with a dielectric material. The dielectric material is selected for its acoustic properties and for its ability to withstand processing steps used to fabricate the BAW resonator device 303. Notably, the dielectric material has an acoustic impedance in order to provide significantly large lateral acoustic impedance discontinuity at the boundary of the active region of BAW resonator device 303. The mechanism of reducing losses in the filled first bridge 107' and the filled first cantilevered portion 108' relies on suppression and confinement of the propagating eigenmodes which are mechanically excited at the perimeter of the active region of the BAW resonator device 303 as a part of piston mode excitation. Both ends of the filled first bridge 107' provide mechanical discontinuities to control the phase of the reflected mode and to provide overall beneficial suppression of the propagating eigenmodes in the active region.

The dielectric material used to fill the filled first bridge 107' and the filled first cantilevered portion 108' is selected to survive etching steps used to form various features of the BAW resonator device 303, such as the cavity 102 and the second bridge 310. Illustratively, the dielectric material used to fill the filled second bridge 110' and the filled second cantilevered portion 111' comprises one of non-etchable borosilicate glass (NEBSG), carbon doped silicon dioxide (CDO), or silicon carbide (SiC).

Figure 4A:
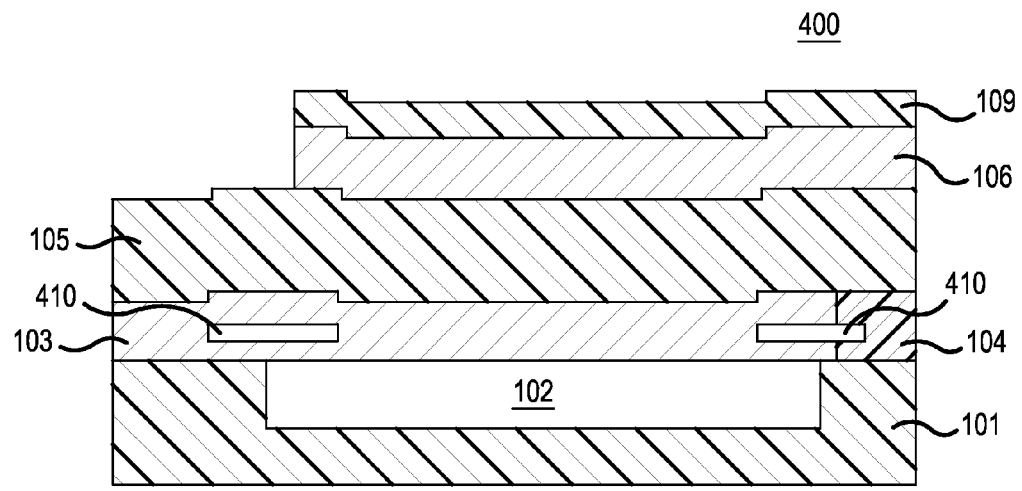
FIGS. 4A-4D are cross-sectional diagrams illustrating BAW resonator devices according to representative embodiments.

According to various embodiments, FIG. 4A is a cross-sectional view of BAW resonator device 400, which includes a ring comprising a bridge, according to a representative embodiment. Many details of the BAW resonator device 400 are common to those of BAW resonator devices 100, 100', 200~203, and 300~303. Often, these details may not be repeated in order to avoid obscuring the description of the presently described representative embodiments.

Referring to FIG. 4A, illustrative BAW resonator device 400 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 400.

Although not shown in FIG. 4A, the BAW resonator device 400 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 400, reducing lost acoustic energy and improving the Q-factor of the BAW resonator device.

The passivation layer 109 is disposed over the second electrode 106. Unlike certain representative embodiments described above, the passivation layer 109 does not feature a ring, filled or unfilled. Rather, BAW resonator device 400 comprises a bridge 410 (that may be referred to as a ring) disposed in the first electrode 103. The bridge 410 may be formed at a mid-point of the thickness of the first electrode 103, or elsewhere within the first electrode 103. The bridge 410 is filled with air, and is disposed along at least a portion of a perimeter along of an active region of the BAW resonator device 400. Notably, the bridge 410 provides an acoustic impedance discontinuity, in essence acoustically terminating the contacting overlap of the first electrode 103, the piezoelectric layer 105 and the second electrode 106, which defines the active region of the BAW resonator device 400. As such, the bridge 410 defines the perimeter of the active region of BAW resonator device 400.

As will be appreciated by one of ordinary skill in the art, by providing the bridge 410 in the first electrode 103, the surface of the first electrode 103 is used to form the piezoelectric layer 105. This results in the growth of a highly textured piezoelectric layer having a well-defined crystalline orientation. As such, the piezoelectric layer 105 as a comparatively improved piezoelectric coupling coefficient ($e_{33}$), and, as a result, has a comparatively improved coupling coefficient ($kt^2$), when compared to a piezoelectric layer formed over bridges provided beneath the piezoelectric layer 105 (e.g., second bridges 310, 310'). Additionally, providing the bridge 410 in the first electrode results in protecting the piezoelectric layer 105 from possible diffusion of elements used to form sacrificial layer defining bridge 410, which may adversely increase viscous loss in the piezoelectric layer deposited over the bridge 410.

Figure 4B:
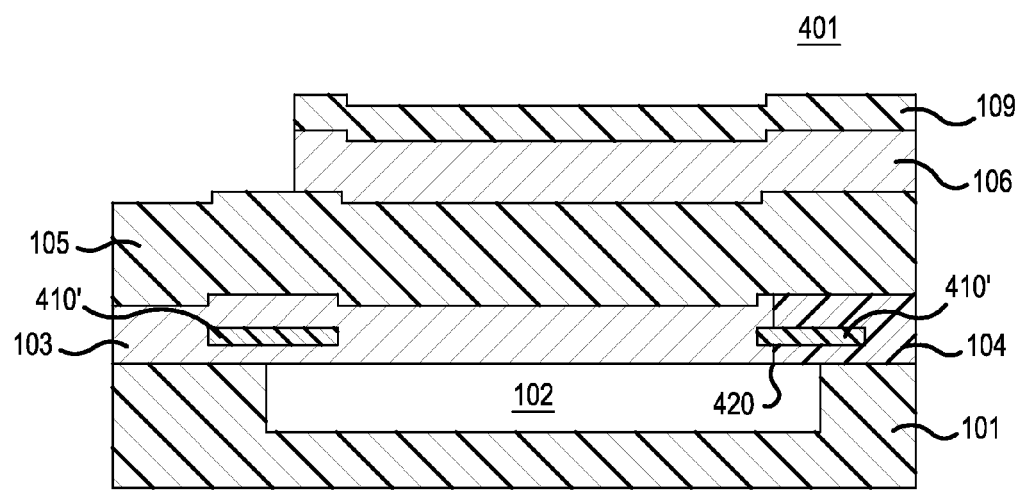

According to various embodiments, FIG. 4B is a cross-sectional view of BAW resonator device 401, which includes a ring comprising a bridge, according to a representative embodiment. Many details of the BAW resonator device 401 are common to those of BAW resonator devices 100, 100', 200~203, 300~303, and 400. Often, these details may not be repeated in order to avoid obscuring the description of the presently described representative embodiments.

Referring to FIG. 4B, illustrative BAW resonator device 401 includes acoustic stack formed over substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 401.

Although not shown in FIG. 4B, the BAW resonator device 401 may also comprises recessed frame element (sometimes referred to as an "innie") and raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 401, reducing lost acoustic energy and improving the Q-factor of the BAW resonator device.

The passivation layer 109 is disposed over the second electrode 106. Unlike representative embodiments described above, the passivation layer does not feature a ring, filled or unfilled. Rather, BAW resonator device 401 comprises a filled bridge 410' (sometimes referred to below as filled second bridge 410') disposed in the first electrode 103. The filled bridge 410' may be formed at a mid-point of the thickness of the first electrode 103, or elsewhere within the first electrode 103. The filled bridge 410' is filled with a dielectric material, and is disposed along at least a portion of a perimeter along of an active region of the BAW resonator device 401. Notably, the filled bridge 410' provides an acoustic impedance discontinuity, in essence terminating the contacting overlap of the first electrode 103, the piezoelectric layer 105 and the second electrode 106, which defines the active region of the BAW resonator device 401. Notably, the dielectric material provided in the filled bridge 410' has an acoustic impedance in order to provide significantly large lateral acoustic impedance discontinuity at the boundary of the active region of BAW resonator device 401. The mechanism of reducing losses in the filled bridge 410' relies on suppression and confinement of the propagating eigenmodes which are mechanically excited at the perimeter of the active region of the BAW resonator device 401 as a part of piston mode excitation. Both ends of the filled bridge 410' provide mechanical discontinuities to control the phase of the reflected mode and to provide overall beneficial suppression of the propagating eigenmodes in the active region.

The dielectric material used to fill the filled bridge 410' is selected to survive etching steps used to form various features of the BAW resonator device 401, such as the cavity 102. Illustratively, the dielectric material used to fill the filled second bridge 110' and the filled second cantilevered portion 111' comprises one of non-etchable borosilicate glass (NEBSG), carbon doped silicon dioxide (CDO), or silicon carbide (SiC).

As will be appreciated by one of ordinary skill in the art, by providing the filled bridge 410' in the first electrode 103, the surface of the first electrode 103 is used to form the piezoelectric layer 105. This results in protecting the piezoelectric layer 105 from possible diffusion of elements used to form filled second bridge 410', which may adversely increase viscous loss in the piezo-electric layer deposited over the filled second bridge 410' region.

As depicted in FIG. 4B, the first electrode 103 terminates over the cavity 102 at a termination point 420, and the planarization layer 104 extends over the cavity 102 to abut the first electrode 103 at the termination point 420. As will be appreciated by one of ordinary skill in the art, if the first electrode terminated over the substrate 101, because the filled bridge 410' is filled with dielectric material, acoustic waves would propagate through the filled bridge 410' and into the substrate 101. Thus, the filled second bridge 410', would allow acoustic energy transfer into the substrate 101, where it would be lost, resulting in a reduced Q-factor. By contrast, because the first electrode 103 terminates over the air-filled cavity, an acoustic impedance discontinuity, acoustic energy is reflected back into the active region of the BAW resonator device 401.

Figure 4C:
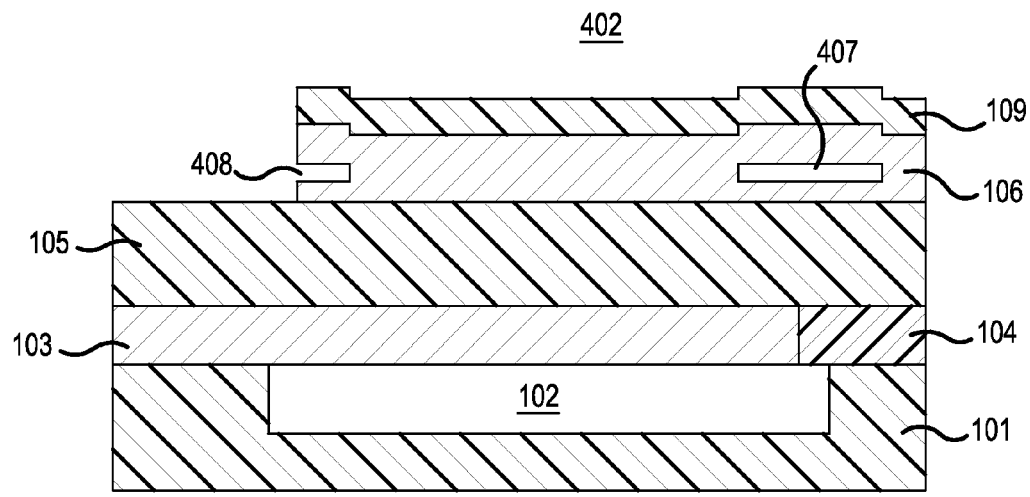

According to various embodiments, FIG. 4C is a cross-sectional view of BAW resonator device 402, which includes a ring comprising a bridge and a cantilevered portion, according to a representative embodiment. Many details of the BAW resonator device 402 are common to those of BAW resonator devices 100, 100', 200~203, 300~303 and 400~401. Often, these details may not be repeated in order to avoid obscuring the description of the presently described representative embodiments.

Referring to FIG. 4C, illustrative BAW resonator device 402 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 402.

Although not shown in FIG. 4C, the BAW resonator device 402 may also comprise recessed frame element (sometimes referred to as an "innie") and raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 402, reducing lost acoustic energy and improving the Q-factor of the BAW resonator device.

The passivation layer 109 is disposed over the second electrode 106. Unlike certain representative embodiments described above, the passivation layer does not feature a ring, filled or unfilled. Rather, BAW resonator device 402 comprises a bridge 407 (sometimes referred to below as a first bridge) disposed in the second electrode 106. The BAW resonator device also comprises a cantilevered portion 408 (also known as a wing) disposed along one side, if not all sides exception the connection side of the passivation layer 109. In combination, herein, the bridge 407 and the cantilevered portion 408 may be referred to as a ring.

The bridge 407 and the cantilevered portion 408 may be formed at a mid-point of the thickness of the first electrode 103, or elsewhere within the first electrode 103. The bridge 407 and the cantilevered portion 408 are filled with air, and is disposed along at least a portion of a perimeter along of an active region of the BAW resonator device 402. Notably, the bridge 407 and the cantilevered portion 408 provide an acoustic impedance discontinuity, in essence acoustically terminating the contacting overlap of the first electrode 103, the piezoelectric layer 105 and the second electrode 106, which defines the active region of the BAW resonator device 402. As such, the bridge 407 and the cantilevered portion define the perimeter of the active region of BAW resonator device 402.

Figure 4D:
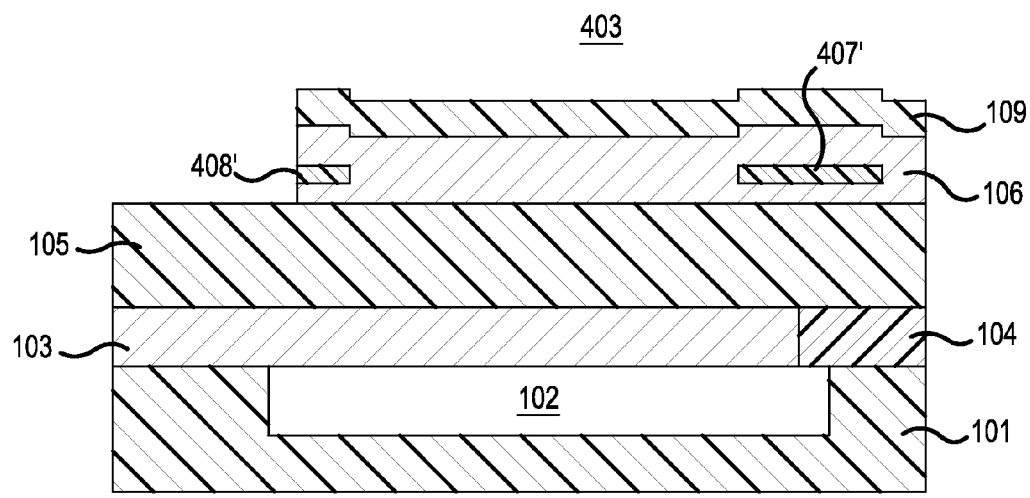

According to various embodiments, FIG. 4D is a cross-sectional view of BAW resonator device 403, which includes a ring, according to a representative embodiment. Many details of the BAW resonator device 403 are common to those of BAW resonator devices 100, 100', 200~203, 300~303, and 400~402. Often, these details may not be repeated in order to avoid obscuring the description of the presently described representative embodiments.

Referring to FIG. 4D, illustrative BAW resonator device 403 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 403.

Although not shown in FIG. 4D, the BAW resonator device 403 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 403, reducing lost acoustic energy and improving the Q-factor of the BAW resonator device.

The passivation layer 109 is disposed over the second electrode 106. Unlike certain representative embodiments described above, the passivation layer does not feature a ring, filled or unfilled. Rather, BAW resonator device 403 comprises a filled bridge 407' (sometimes referred to below as a filled first bridge) and filled cantilevered portion 408' disposed in the second electrode 106. In combination, the filled bridge 407' and the filled cantilevered portion 408' provide a filled ring.

The filled bridge 407' and the filled cantilevered portion 408' may be formed at a mid-point of the thickness of the first electrode 103, or elsewhere within the first electrode 103. The filled bridge 407' and the filled cantilevered portion 408' are filled with a dielectric material, and is disposed along at least a portion of a perimeter along of an active region of the BAW resonator device 403. Notably, the filled bridge 407' provides an acoustic impedance discontinuity, in essence terminating the contacting overlap of the first electrode 103, the piezoelectric layer 105 and the second electrode 106, which defines the active region of the BAW resonator device 401. Notably, the dielectric material provided in the filled bridge 407' and the cantilevered portion 408 has an acoustic impedance in order to provide significantly large lateral acoustic impedance discontinuity at the boundary of the active region of BAW resonator device 403. The mechanism of reducing losses in the filled bridge 407' relies on suppression and confinement of the propagating eigenmodes which are mechanically excited at the perimeter of the active region of the BAW resonator device 403 as a part of piston mode excitation. Both ends of the filled bridge 407' and the filled cantilevered portion 408' provide mechanical discontinuities to control the phase of the reflected mode and to provide overall beneficial suppression of the propagating eigenmodes in the active region.

The dielectric material used to fill the filled bridge 407' and the filled cantilevered portion 408' is selected to survive etching steps used to form various features of the BAW resonator device 302, such as the cavity 102. Illustratively, the dielectric material used to fill the filled bridge 407' and the filled cantilevered portion 408' comprises one of non-etchable borosilicate glass (NEBSG), carbon doped silicon dioxide (CDO), or silicon carbide (SiC).

Figure 5A:
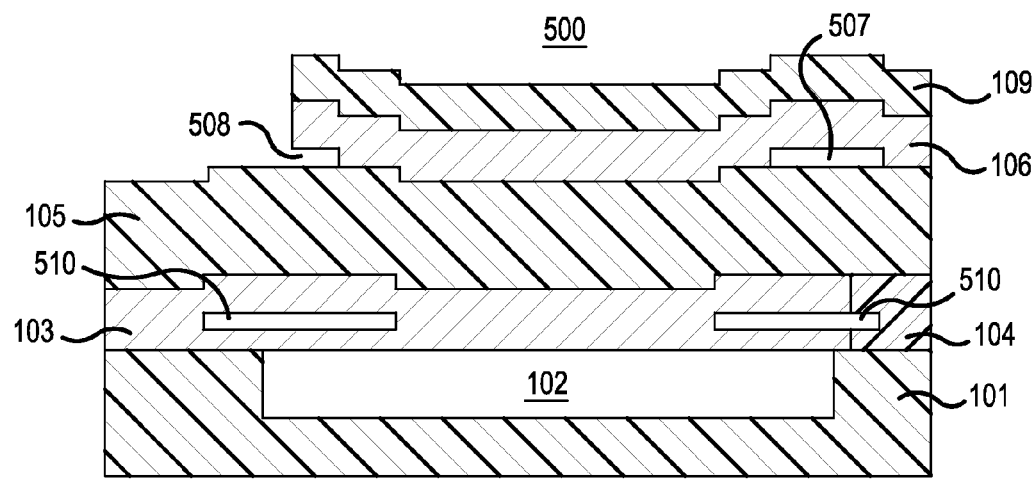
FIGS. 5A-5D are cross-sectional diagrams illustrating BAW resonator devices according to representative embodiments.

According to various embodiments, FIG. 5A is a cross-sectional view of BAW resonator device 500, which includes a ring, according to a representative embodiment. Many details of the BAW resonator device 500 are common to those of BAW resonator devices 100, 100', 200~203, 300~303, and 400~403. Often, these details may not be repeated in order to avoid obscuring the description of the presently described representative embodiments.

Referring to FIG. 5A, illustrative BAW resonator device 500 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 403.

Although not shown in FIG. 5A, the BAW resonator device 500 may also comprise recessed frame element (sometimes referred to as an "innie") and raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 500, reducing lost acoustic energy and improving the Q-factor of the BAW resonator device.

The second electrode 106 may be connected on connection side that comprises a first bridge 507. The second electrode 106 also comprises a cantilevered portion 508 (also known as a wing) disposed along at least one side, if not all sides exception the connection side of the second electrode 106. In combination, herein, the first bridge 507 and the cantilevered portion 508 may be referred to as a first ring. The second cantilevered portion 111 is described, for example, in U.S. Patent Application 20120326807 and the second bridge 110 is described, for example, in U.S. Pat. No. 8,248,185 referenced above.

BAW resonator device 500 comprises a second bridge 510 disposed in the first electrode 103. The second bridge 510 may be formed at a mid-point of the thickness of the first electrode 103, or elsewhere within the first electrode 103. The second bridge 510 is filled with air, and is disposed along at least a portion of a perimeter along of an active region of the BAW resonator device 500. Notably, the inner edge of most inwardly extending the first bridge 507 and the second bridge 510 provides an acoustic impedance discontinuity, in essence acoustically terminating the contacting overlap of the first electrode 103, the piezoelectric layer 105 and the second electrode 106, which defines the active region of the BAW resonator device 500. According to the representative embodiment shown in FIG. 5A, the second bridge 510 defines the perimeter of the active region of BAW resonator device 500.

Figure 5B:
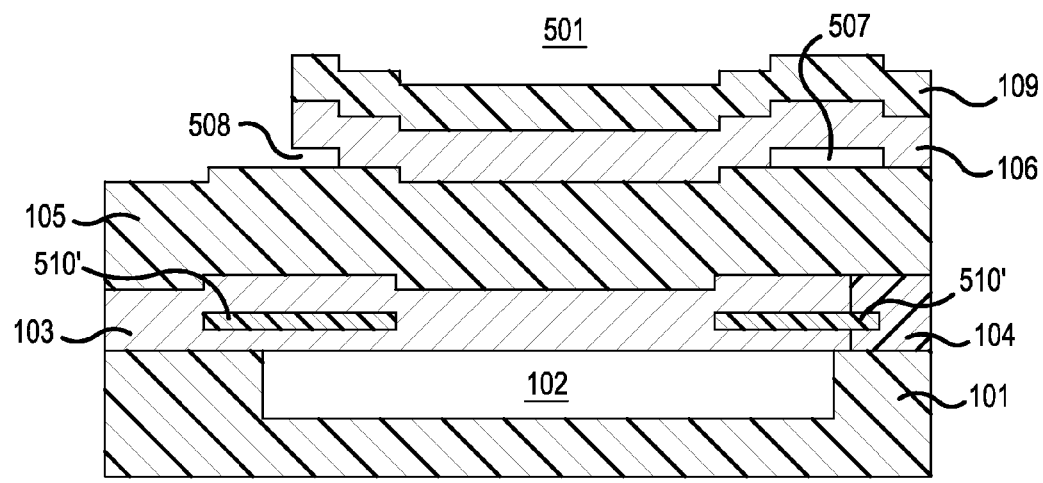

According to various embodiments, FIG. 5B is a cross-sectional view of BAW resonator device 501, which includes a ring, according to a representative embodiment. Many details of the BAW resonator device 501 are common to those of BAW resonator devices 100, 100', 200~203, 300~303, 400~403 and 500. Often, these details may not be repeated in order to avoid obscuring the description of the presently described representative embodiments.

Referring to FIG. 5B, illustrative BAW resonator device 501 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 501.

Although not shown in FIG. 5B, the BAW resonator device 501 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 501, reducing lost acoustic energy and improving the Q-factor of the BAW resonator device.

The second electrode 106 may be connected on connection side that comprises a first bridge 507. The second electrode 106 also comprises a cantilevered portion 508 (also known as a wing) disposed along at least one side, if not all sides exception the connection side of the second electrode 106. In combination, herein, the first bridge 507 and the cantilevered portion 508 may be referred to as a first ring. The second cantilevered portion 111 is described, for example, in U.S. Patent Application 20120326807 and the second bridge 110 is described, for example, in U.S. Pat. No. 8,248,185 referenced above.

BAW resonator device 501 comprises a filled second bridge 510' disposed in the first electrode 103. The filled second bridge 510' may be formed at a mid-point of the thickness of the first electrode 103, or elsewhere within the first electrode 103. The filled second bridge 510' may be formed at a mid-point of the thickness of the first electrode 103, or elsewhere within the first electrode 103. The filled second bridge 510' is filled with a dielectric material, and is disposed along at least a portion of a perimeter along of an active region of the BAW resonator device 501. Notably, the inner edge of most inwardly extending the first bridge 507 and the filled second bridge 510' provides an acoustic impedance discontinuity, in essence terminating the contacting overlap of the first electrode 103, the piezoelectric layer 105 and the second electrode 106, which defines the active region of the BAW resonator device 501. Notably, the dielectric material provided in the filled second bridge 510' has an acoustic impedance in order to provide significantly large lateral acoustic impedance discontinuity at the boundary of the active region of BAW resonator device 501. The mechanism of reducing losses in the filled second bridge 510' relies on suppression and confinement of the propagating eigenmodes which are mechanically excited at the perimeter of the active region of the BAW resonator device 501 as a part of piston mode excitation. Both ends of the first bridge 507 and the filled second bridge 510' provide mechanical discontinuities to control the phase of the reflected mode and to provide overall beneficial suppression of the propagating eigenmodes in the active region.

The dielectric material used to fill the filled second bridge 510' is selected to survive etching steps used to form various features of the BAW resonator device 501, such as the cavity 102. Illustratively, the dielectric material used to fill the filled second bridge 510' comprises one of non-etchable borosilicate glass (NEBSG), carbon doped silicon dioxide (CDO), or silicon carbide (SiC).

Figure 5C:
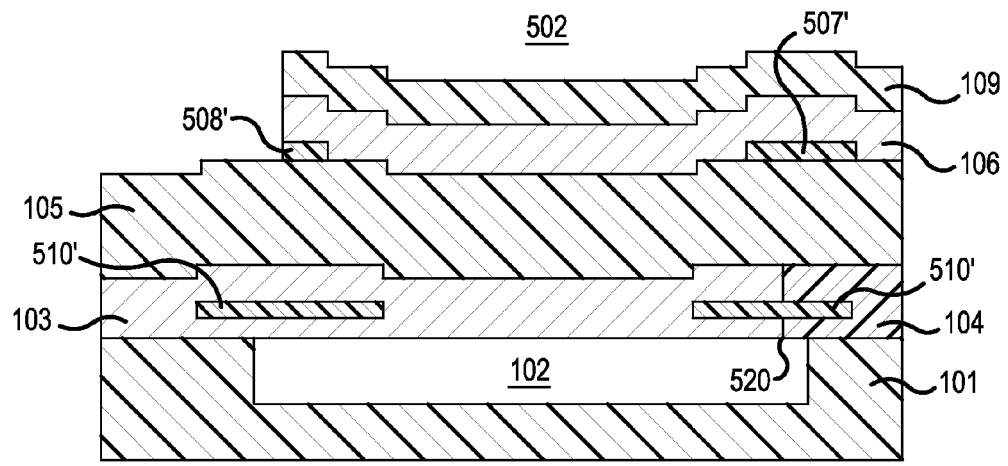

According to various embodiments, FIG. 5C is a cross-sectional view of BAW resonator device 502, which includes a ring, according to a representative embodiment. Many details of the BAW resonator device 502 are common to those of BAW resonator devices 100, 100', 200~203, 300~303, 400~403 and 500~501. Often, these details may not be repeated in order to avoid obscuring the description of the presently described representative embodiments.

Referring to FIG. 5C, illustrative BAW resonator device 502 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 502.

Although not shown in FIG. 5C, the BAW resonator device 502 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 502, reducing lost acoustic energy and improving the Q-factor of the BAW resonator device.

The second electrode 106 may be connected on connection side that comprises a filled first bridge 507'. The second electrode 106 also comprises a filled cantilevered portion 508' (also known as a wing) disposed along at least one side, if not all sides exception the connection side of the second electrode 106. The filled first bridge 507' is filled with a dielectric material, and is disposed along at least a portion of a perimeter along of an active region of the BAW resonator device 502. In combination, herein, the filled first bridge 507' and the filled cantilevered portion 508' may be referred to as a filled first ring.

BAW resonator device 500 comprises filled second bridge 510' disposed in the first electrode 103. The filled second bridge 510' may be formed at a mid-point of the thickness of the first electrode 103, or elsewhere within the first electrode 103. The filled second bridge 510' may be formed at a mid-point of the thickness of the first electrode 103, or elsewhere within the first electrode 103. The filled second bridge 510' is filled with a dielectric material, and is disposed along at least a portion of a perimeter along of an active region of the BAW resonator device 501.

As depicted in FIG. 5C, the first electrode 103 terminates over the cavity 102 at a termination point 520, and the planarization layer 104 extends over the cavity 102 to abut the first electrode 103 at the termination point 520. As will be appreciated by one of ordinary skill in the art, if the first electrode terminated over the substrate 101, because the filled second bridge 510' is filled with dielectric material, acoustic waves would propagate through the filled second bridge 510' and into the substrate 101. Thus, the filled second bridge 510', would allow acoustic energy transfer into the substrate 101, where it would be lost, resulting in a reduced Q-factor. By contrast, because the first electrode 103 terminates over the air-filled cavity, an acoustic impedance discontinuity, acoustic energy is reflected back into the active region of the BAW resonator device 502.

Notably, the inner edge of most inwardly extending part of the filled first bridge 507' and the filled second bridge 510' provide acoustic impedance discontinuities, in essence terminating the contacting overlap of the first electrode 103, the piezoelectric layer 105 and the second electrode 106, which defines the active region of the BAW resonator device 502. Notably, the dielectric material provided in the filled first bridge 507' and the filled second bridge 510' has an acoustic impedance in order to provide significantly large lateral acoustic impedance discontinuity at the boundary of the active region of BAW resonator device 502. The mechanism of reducing losses in the filled first bridge 507' and the filled second bridge 510' relies on suppression and confinement of the propagating eigenmodes which are mechanically excited at the perimeter of the active region of the BAW resonator device 502 as a part of piston mode excitation. Both ends of each of the filled first bridge 507' and the filled second bridge 510' provide mechanical discontinuities to control the phase of the reflected mode and to provide overall beneficial suppression of the propagating eigenmodes in the active region.

The dielectric material used to fill the filled second bridge 510' is selected to survive etching steps used to form various features of the BAW resonator device 502, such as the cavity 102. Illustratively, the dielectric material used to fill the filled second bridge 510' comprises one of non-etchable borosilicate glass (NEBSG), carbon doped silicon dioxide (CDO), or silicon carbide (SiC).

Figure 5D:
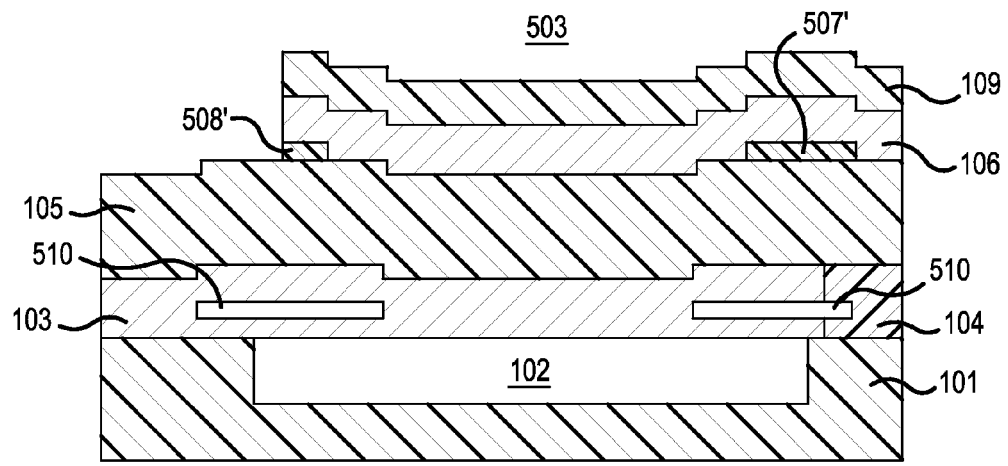

According to various embodiments, FIG. 5D is a cross-sectional view of BAW resonator device 503, which includes a ring, according to a representative embodiment. Many details of the BAW resonator device 502 are common to those of BAW resonator devices 100, 100', 200~203, 300~303, 400~403 and 500~502. Often, these details may not be repeated in order to avoid obscuring the description of the presently described representative embodiments.

Referring to FIG. 5D, illustrative BAW resonator device 503 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 503.

Although not shown in FIG. 5D, the BAW resonator device 503 may also comprises recessed frame element (sometimes referred to as an "innie") and raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 503, reducing lost acoustic energy and improving the Q-factor of the BAW resonator device.

The second electrode 106 may be connected on connection side that comprises a filled first bridge 507'. The second electrode 106 also comprises a filled cantilevered portion 508' (also known as a wing) disposed along at least one side, if not all sides exception the connection side of the second electrode 106. The filled second bridge 510' is filled with a dielectric material, and is disposed along at least a portion of a perimeter along of an active region of the BAW resonator device 501. In combination, herein, the filled first bridge 507' and the filled cantilevered portion 508' may be referred to as a filled first ring.

BAW resonator device 503 comprises second bridge 510 disposed in the first electrode 103. The second bridge 510 may be formed at a mid-point of the thickness of the first electrode 103, or elsewhere within the first electrode 103. The second bridge 510 may be formed at a mid-point of the thickness of the first electrode 103, or elsewhere within the first electrode 103. The second bridge 510 is filled with air, and is disposed along at least a portion of a perimeter along of an active region of the BAW resonator device 503.

Notably, the inner edge of most inwardly extending portion of the filled first bridge 507' and the second bridge 510 provide acoustic impedance discontinuities, in essence terminating the contacting overlap of the first electrode 103, the piezoelectric layer 105 and the second electrode 106, which defines the active region of the BAW resonator device 501. Notably, the dielectric material provided in the filled first bridge 507' and the air provided in the second bridge 510 each have an acoustic impedance in order to provide significantly large lateral acoustic impedance discontinuity at the boundary of the active region of BAW resonator device 503. The mechanism of reducing losses in the filled first bridge 507' and the second bridge 510 relies on suppression and confinement of the propagating eigenmodes which are mechanically excited at the perimeter of the active region of the BAW resonator device 503 as a part of piston mode excitation. Both ends of each of the filled first bridge 507' and the second bridge 510 provide mechanical discontinuities to control the phase of the reflected mode and to provide overall beneficial suppression of the propagating eigenmodes in the active region.

The dielectric material used to fill the filled first bridge 507' and the filled cantilevered portion 508' is selected to survive etching steps used to form various features of the BAW resonator device 501, such as the cavity 102, and second bridge 510. Illustratively, the dielectric material used to fill the filled first bridge 507' and the filled cantilevered portion 508' comprises one of non-etchable borosilicate glass (NEBSG), carbon doped silicon dioxide (CDO), or silicon carbide (SiC).

Figure 6A:
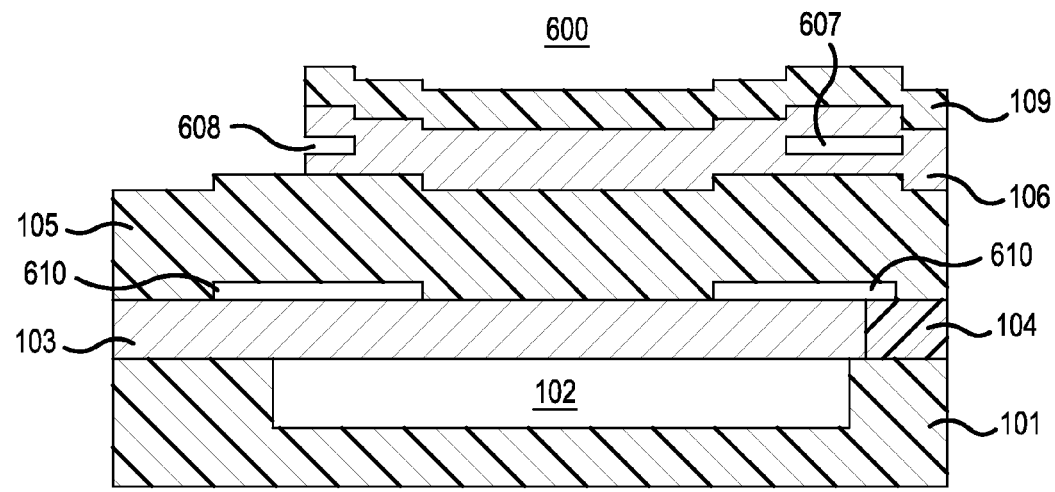
FIGS. 6A-6D are cross-sectional diagrams illustrating BAW resonator devices according to representative embodiments.

According to various embodiments, FIG. 6A is a cross-sectional view of BAW resonator device 600, which includes a ring, according to a representative embodiment. Many details of the BAW resonator device 600 are common to those of BAW resonator devices 100, 100', 200~203, 300~303, 400~403 and 500~503. Often, these details may not be repeated in order to avoid obscuring the description of the presently described representative embodiments.

Referring to FIG. 6A, illustrative BAW resonator device 600 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 600.

Although not shown in FIG. 6A, the BAW resonator device 600 may also comprise a recessed frame element (sometimes referred to as an "innie") and a raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 600, reducing lost acoustic energy and improving the Q-factor of the BAW resonator device.

The second electrode 106 may be connected on connection side that comprises a first bridge 607. The first bridge 607 is disposed along at least a portion of a perimeter along of an active region of the BAW resonator device 600. The second electrode 106 also comprises a cantilevered portion 608. The first bridge 607 and the cantilevered portion 608 are filled with air, and in combination may be referred to as a ring. The first bridge 607 and the cantilevered portion 608 may each be formed at a mid-point of the thickness of the second electrode 106, or elsewhere within the second electrode 106.

BAW resonator device 600 comprises a second bridge 610 disposed in the first electrode 103. The second bridge 610 may be formed at a mid-point of the thickness of the first electrode 103, or elsewhere within the first electrode 103. The second bridge 610 is filled with air, and is disposed along at least a portion of a perimeter along of an active region of the BAW resonator device 600. Notably, the inner edge of most inwardly extending portion of the first bridge 607 and the cantilevered portion 608, and the second bridge 610 provide an acoustic impedance discontinuity, in essence acoustically terminating the contacting overlap of the first electrode 103, the piezoelectric layer 105 and the second electrode 106, which defines the active region of the BAW resonator device 600. As such, the inner edge of most inwardly extending portion of the first bridge 607, the cantilevered portion 608, and the second bridge 610 define the perimeter of the active region of BAW resonator device 600.

Figure 6B:
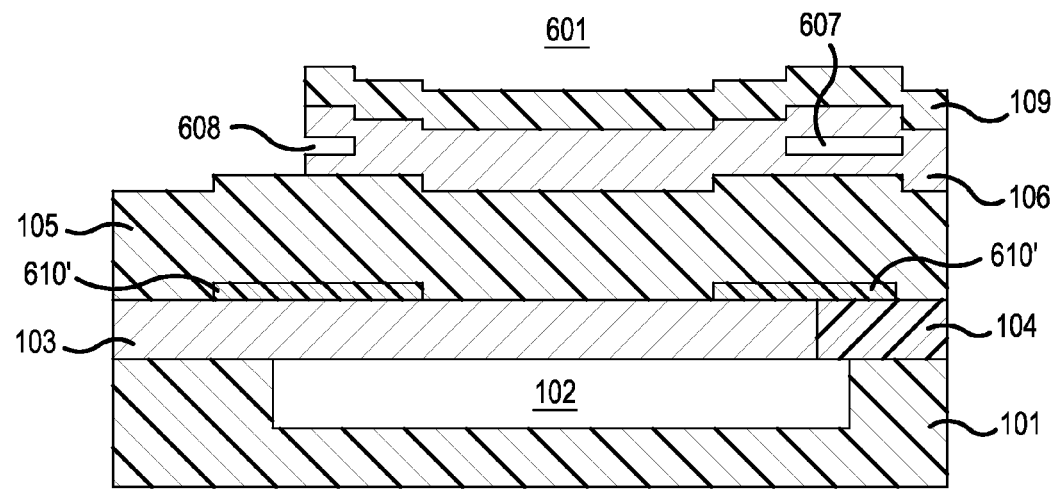

According to various embodiments, FIG. 6B is a cross-sectional view of BAW resonator device 601, which includes a ring, according to a representative embodiment. Many details of the BAW resonator device 601 are common to those of BAW resonator devices 100, 100', 200~203, 300~303, 400~403, 500~503 and 600. Often, these details may not be repeated in order to avoid obscuring the description of the presently described representative embodiments.

Referring to FIG. 6B, illustrative BAW resonator device 601 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 403.

Although not shown in FIG. 6B, the BAW resonator device 601 may also comprise a recessed frame element (sometimes referred to as an "innie") and a raised frame element (sometimes referred to as an "outie") provided in the second electrode 106. As is know, a recessed frame element and a raised frame element provide an acoustic impedance mismatch that serves to foster reflections of acoustic waves back into active region of the BAW resonator device 601, reducing lost acoustic energy and improving the Q-factor of the BAW resonator device.

The second electrode 106 may be connected on connection side that comprises the first bridge 607 that is disposed along at least a portion of a perimeter along of an active region of the BAW resonator device 601, and may be referred to as a first ring. The second electrode 106 also comprises the cantilevered portion 608. The first bridge 607 and the cantilevered portion 608 may be formed at a mid-point of the thickness of the second electrode 106, or elsewhere within the second electrode 106.

BAW resonator device 601 comprises a filled second bridge 610' disposed in the piezoelectric layer 105 between the first electrode 103 and the piezoelectric layer 105. The filled second bridge 610' is filled with a dielectric material, and is disposed along at least a portion of a perimeter along of an active region of the BAW resonator device 601. Notably, the inner edge of most inwardly extending portions of the first bridge 607 and the cantilevered portion 608, and the filled second bridge 610' provides an acoustic impedance discontinuity, in essence terminating the contacting overlap of the first electrode 103, the piezoelectric layer 105 and the second electrode 106, which defines the active region of the BAW resonator device 601. Notably, the dielectric material provided in the filled second bridge 610' has an acoustic impedance in order to provide significantly large lateral acoustic impedance discontinuity at the boundary of the active region of BAW resonator device 601. The mechanism of reducing losses in first bridge 607, the cantilevered portion 608, and the filled second bridge 610' relies on suppression and confinement of the propagating eigenmodes which are mechanically excited at the perimeter of the active region of the BAW resonator device 601 as a part of piston mode excitation. The first bridge 607, cantilevered portion 608 and the filled second bridge 610' provide mechanical discontinuities to control the phase of the reflected mode and to provide overall beneficial suppression of the propagating eigenmodes in the active region.

The dielectric material used to fill the filled second bridge 610' is selected to survive etching steps used to form various features of the BAW resonator device 601, such as the cavity 102. Illustratively, the dielectric material used to fill the filled second bridge 610' comprises one of non-etchable borosilicate glass (NEBSG), carbon doped silicon dioxide (CDO), or silicon carbide (SiC).

Figure 6C:
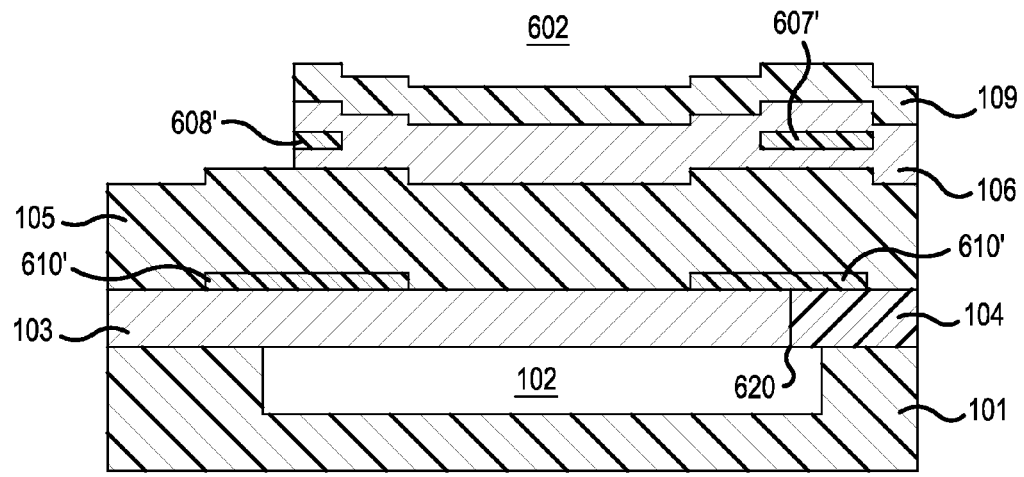

According to various embodiments, FIG. 6C is a cross-sectional view of BAW resonator device 602, which includes a ring, according to a representative embodiment. Many details of the BAW resonator device 602 are common to those of BAW resonator devices 100, 100', 200~203, 300~303, 400~403, 500~503, 600~601. Often, these details may not be repeated in order to avoid obscuring the description of the presently described representative embodiments.

Referring to FIG. 6C, illustrative BAW resonator device 602 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 602.

Although not shown in FIG. 6C, the BAW resonator device 602 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 602, reducing lost acoustic energy and improving the Q-factor of the BAW resonator device.

The second electrode 106 may be connected on connection side that comprises a filled first bridge 607' disposed along at least a portion of a perimeter along of an active region of the BAW resonator device 602. The second electrode also comprise a filled cantilevered portion 608'. The filled first bridge 607' and the filled cantilevered portion 608' are filled with a dielectric material, and are disposed along at least a portion of a perimeter along of an active region of the BAW resonator device 602. In combination, herein, the filled first bridge 607' and the filled cantilevered portion 608' may be referred to as a filled first ring.

BAW resonator device 602 comprises filled second bridge 610' disposed in the first electrode 103. The filled second bridge 610' is formed in the piezoelectric layer 105, and between the first electrode 103 and the piezoelectric layer 105. The filled second bridge 610' is filled with a dielectric material, and is disposed along at least a portion of a perimeter along of an active region of the BAW resonator device 602.

As depicted in FIG. 6C, the first electrode 103 terminates over the cavity 102 at a termination point 620, and the planarization layer 104 extends over the cavity 102 to abut the first electrode 103 at the termination point 620. As will be appreciated by one of ordinary skill in the art, if the first electrode terminated over the substrate 101, because the filled second bridge 610' is filled with dielectric material, acoustic waves would propagate through the filled second bridge 610' and into the substrate 101. Thus, the filled second bridge 610', would allow acoustic energy transfer into the substrate 101, where it would be lost, resulting in a reduced Q-factor. By contrast, because the first electrode 103 terminates over the air-filled cavity, an acoustic impedance discontinuity, acoustic energy is reflected back into the active region of the BAW resonator device 602.

Notably, the inner edge of most inwardly extending portions of the filled first bridge 607', the filled cantilevered portion 608' and the filled second bridge 610' provide acoustic impedance discontinuities, in essence terminating the contacting overlap of the first electrode 103, the piezoelectric layer 105 and the second electrode 106, which defines the active region of the BAW resonator device 602. Notably, the dielectric material provided in the filled first bridge 607', the filled cantilevered portion 608', and the filled second bridge 610' has an acoustic impedance in order to provide significantly large lateral acoustic impedance discontinuity at the boundary of the active region of BAW resonator device 602. The mechanism of reducing losses in the filled first bridge 607', the filled cantilevered portion 608', and the filled second bridge 610' relies on suppression and confinement of the propagating eigenmodes which are mechanically excited at the perimeter of the active region of the BAW resonator device 602 as a part of piston mode excitation. The filled first bridge 607', the filled cantilevered portion 608' and the filled second bridge 610' provide mechanical discontinuities to control the phase of the reflected mode and to provide overall beneficial suppression of the propagating eigenmodes in the active region.

The dielectric material used to fill the filled first bridge 607', the filled cantilevered portion 608', and the filled second bridge 610' is selected to survive etching steps used to form various features of the BAW resonator device 602, such as the cavity 102. Illustratively, the dielectric material used to fill the filled first bridge 607', the filled cantilevered portion 608', and the filled second bridge 610' comprises one of non-etchable borosilicate glass (NEBSG), carbon doped silicon dioxide (CDO), or silicon carbide (SiC).

Figure 6D:
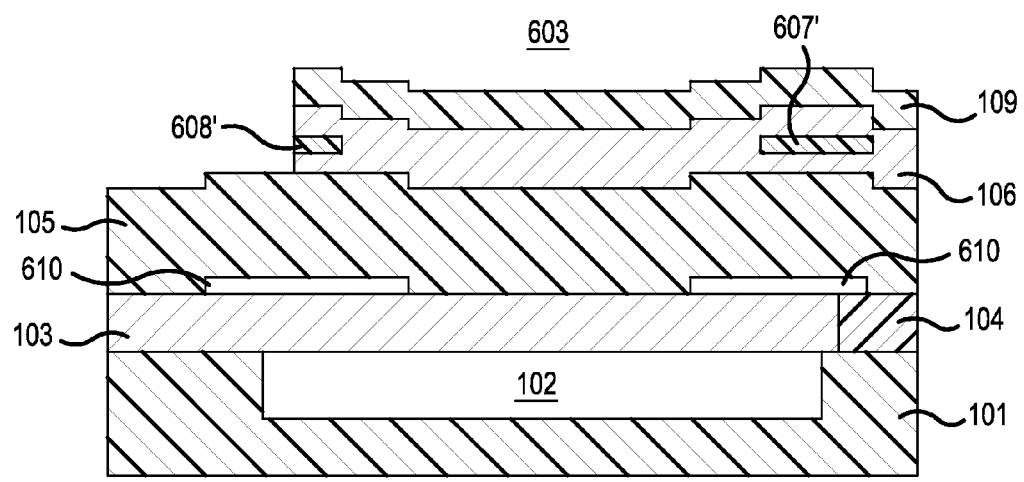

According to various embodiments, FIG. 6D is a cross-sectional view of BAW resonator device 603, which includes a ring, according to a representative embodiment. Many details of the BAW resonator device 603 are common to those of BAW resonator devices 100, 100', 200~203, 300~303, 400~403, 500~503, and 600~602. Often, these details may not be repeated in order to avoid obscuring the description of the presently described representative embodiments.

Referring to FIG. 6D, illustrative BAW resonator device 603 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 603.

Although not shown in FIG. 6D, the BAW resonator device 603 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 603, reducing lost acoustic energy and improving the Q-factor of the BAW resonator device.

The second electrode 106 may be connected on connection side that comprises a filled first bridge 607'. The second electrode 106 also comprises a filled cantilevered portion 508' (also known as a wing) disposed along at least one side, if not all sides exception the connection side of the second electrode 106. The second electrode 106 also comprises filled cantilevered portion 608'. The filled first bridge 607' and the filled cantilevered portion 608' are filled with a dielectric material, and are disposed along at least a portion of a perimeter along of an active region of the BAW resonator device 603. In combination, the filled first bridge 607' and the filled cantilevered portion 608' may be referred to as a filled first ring.

BAW resonator device 603 comprises second bridge 610 disposed in the piezoelectric layer 105 and between the piezoelectric layer 105 and the first electrode 103. The second bridge 610 is filled with air, and is disposed along at least a portion of a perimeter along of an active region of the BAW resonator device 603. The second bridge may be referred to as a second ring.

Notably, the inner edge of most inwardly extending portion of the filled first bridge 607', the filled cantilevered portion 608', and the second bridge 610 provide acoustic impedance discontinuities, in essence terminating the contacting overlap of the first electrode 103, the piezoelectric layer 105 and the second electrode 106, which defines the active region of the BAW resonator device 603. Notably, the dielectric material provided in the filled first bridge 607' and the filled cantilevered portion 608', and the air provided in the second bridge 610 each have an acoustic impedance in order to provide significantly large lateral acoustic impedance discontinuity at the boundary of the active region of BAW resonator device 603. The mechanism of reducing losses in the filled first bridge 607', the filled cantilevered portion 608', and the second bridge 610 relies on suppression and confinement of the propagating eigenmodes which are mechanically excited at the perimeter of the active region of the BAW resonator device 603 as a part of piston mode excitation. Both ends of each of the filled first bridge 607', the filled cantilevered portion 608', and the second bridge 610 provide mechanical discontinuities to control the phase of the reflected mode and to provide overall beneficial suppression of the propagating eigenmodes in the active region.

The dielectric material used to fill the filled first bridge 607' and the filled cantilevered portion 608' is selected to survive etching steps used to form various features of the BAW resonator device 603, such as the cavity 102, and second bridge 610. Illustratively, the dielectric material used to fill the filled first bridge 607' and the filled cantilevered portion 608' comprises one of non-etchable borosilicate glass (NEBSG), carbon doped silicon dioxide (CDO), or silicon carbide (SiC).

Figure 7A:
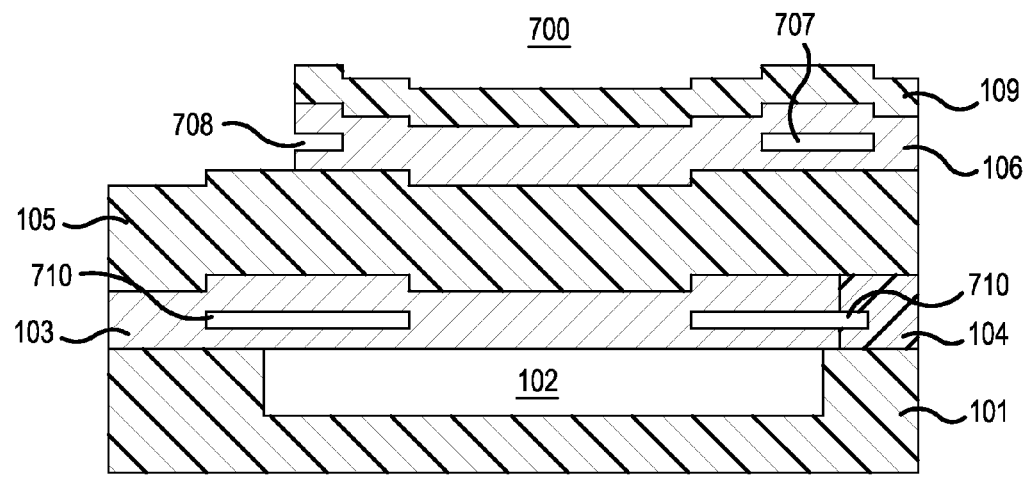
FIGS. 7A-7D are cross-sectional diagrams illustrating BAW resonator devices according to representative embodiments.

According to various embodiments, FIG. 7A is a cross-sectional view of BAW resonator device 700, which includes a ring, according to a representative embodiment. Many details of the BAW resonator device 700 are common to those of BAW resonator devices 100, 100', 200~203, 300~303, 400~403, 500~503 and 600~603. Often, these details may not be repeated in order to avoid obscuring the description of the presently described representative embodiments.

Referring to FIG. 7A, illustrative BAW resonator device 700 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 700.

Although not shown in FIG. 7A, the BAW resonator device 700 may also comprise a recessed frame element (sometimes referred to as an "innie") and a raised frame element (sometimes referred to as an "outie") provided in the second electrode 106. As is know, recessed frame element and raised frame element provide an acoustic impedance mismatch that serves to foster reflections of acoustic waves back into active region of the BAW resonator device 700, reducing lost acoustic energy and improving the Q-factor of the BAW resonator device.

The second electrode 106 may be connected on connection side that comprises a first bridge 707. The first bridge 707 is disposed along at least a portion of a perimeter along of an active region of the BAW resonator device 700. The second electrode also comprise a first cantilevered portion 708. The first bridge 707 and the first cantilevered portion 708 are filled with air, and, in combination, may be referred to as a first ring. The first bridge 707 and the first cantilevered portion 708 may be formed at a mid-point of the thickness of the second electrode 106, or elsewhere within the second electrode 106.

BAW resonator device 700 comprises a second bridge 710 disposed in the first electrode 103. The second bridge 710 may be referred to as a second ring. The second bridge 710 may be formed at a mid-point of the thickness of the first electrode 103, or elsewhere within the first electrode 103. The second bridge 710 is filled with air, and is disposed along at least a portion of a perimeter along of an active region of the BAW resonator device 700. Notably, the inner edge of most inwardly extending portions of the first bridge 707, the first cantilevered portion 708, and the second bridge 710 provide an acoustic impedance discontinuity, in essence acoustically terminating the contacting overlap of the first electrode 103, the piezoelectric layer 105 and the second electrode 106, which defines the active region of the BAW resonator device 700. As such, the inner edge of most inwardly extending portions of the first bridge 707, the first cantilevered portion 708, and the second bridge 710 define the perimeter of the active region of BAW resonator device 700.

Figure 7B:
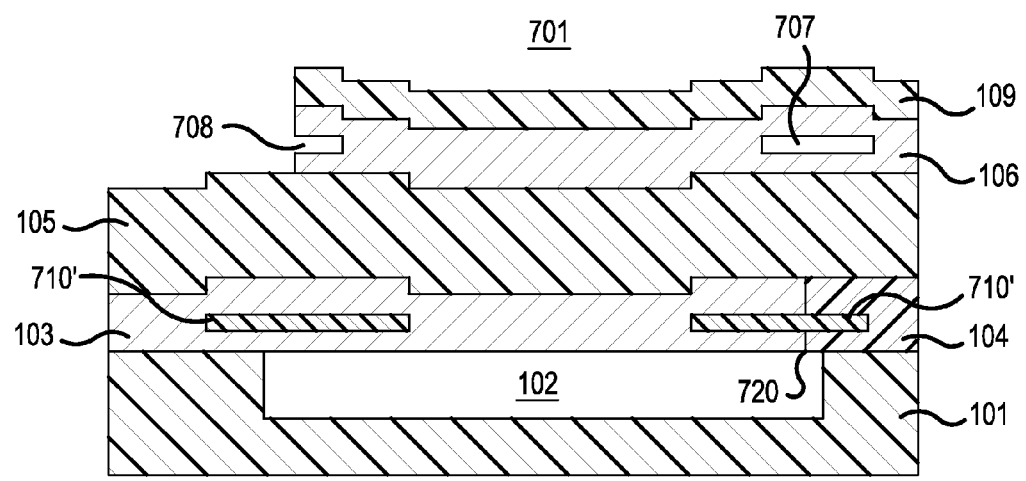

According to various embodiments, FIG. 7B is a cross-sectional view of BAW resonator device 701, which includes a ring, according to a representative embodiment. Many details of the BAW resonator device 701 are common to those of BAW resonator devices 100, 100', 200~203, 300~303, 400~403, 500~503, 600~603 and 700. Often, these details may not be repeated in order to avoid obscuring the description of the presently described representative embodiments.

Referring to FIG. 7B, illustrative BAW resonator device 701 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 701.

Although not shown in FIG. 7B, the BAW resonator device 701 may also comprise a recessed frame element (sometimes referred to as an "innie") and a raised frame element (sometimes referred to as an "outie") provided in the second electrode 106. As is know, a recessed frame element and a raised frame element provide an acoustic impedance mismatch that serves to foster reflections of acoustic waves back into active region of the BAW resonator device 701, reducing lost acoustic energy and improving the Q-factor of the BAW resonator device.

The second electrode 106 may be connected on connection side that comprises the first bridge 707 and the first cantilevered portion 708. The first bridge 707 and the first cantilevered portion 708 are disposed along at least a portion of a perimeter along of an active region of the BAW resonator device 701, and may be referred to as a first ring. The first bridge 707 and the first cantilevered portion 708 may each be formed at a mid-point of the thickness of the second electrode 106, or elsewhere within the second electrode 106.

BAW resonator device 701 comprises a filled second bridge 710' disposed in the first electrode 103 and the piezoelectric layer 105. The filled second bridge 710' may be referred to as a filled second ring. The filled second bridge 710' may be formed at a mid-point of the thickness of the first electrode 103, or elsewhere within the first electrode 103. The filled second bridge 710' is filled with a dielectric material, and is disposed along at least a portion of a perimeter along of an active region of the BAW resonator device 701. Notably, inner edge of most inwardly extending portions of the first bridge 707, the first cantilevered portion 708, and the filled second bridge 710' provide an acoustic impedance discontinuity, in essence terminating the contacting overlap of the first electrode 103, the piezoelectric layer 105 and the second electrode 106, which defines the active region of the BAW resonator device 701. Notably, the dielectric material provided in the filled second bridge 710' has an acoustic impedance in order to provide significantly large lateral acoustic impedance discontinuity at the boundary of the active region of BAW resonator device 701. The mechanism of reducing losses in first bridge 707, the first cantilevered portion 708, and the filled second bridge 710' relies on suppression and confinement of the propagating eigenmodes, which are mechanically excited at the perimeter of the active region of the BAW resonator device 701 as a part of piston mode excitation. The first bridge 707, the first cantilevered portion 708, and the filled second bridge 710' provide mechanical discontinuities to control the phase of the reflected mode and to provide overall beneficial suppression of the propagating eigenmodes in the active region.

The dielectric material used to fill the filled second bridge 710' is selected to survive etching steps used to form various features of the BAW resonator device 701, such as the cavity 102. Illustratively, the dielectric material used to fill the filled second bridge 710' comprises one of non-etchable borosilicate glass (NEBSG), carbon doped silicon dioxide (CDO), or silicon carbide (SiC).

As depicted in FIG. 7B, the first electrode 103 terminates over the cavity 102 at a termination point 720, and the planarization layer 104 extends over the cavity 102 to abut the first electrode 103 at the termination point 720. As will be appreciated by one of ordinary skill in the art, if the first electrode terminated over the substrate 101, because the filled second bridge 710' is filled with dielectric material, acoustic waves would propagate through the filled second bridge 710' and into the substrate 101. Thus, the filled second bridge 710', would allow acoustic energy transfer into the substrate 101, where it would be lost, resulting in a reduced Q-factor. By contrast, because the first electrode 103 terminates over the air-filled cavity, an acoustic impedance discontinuity, acoustic energy is reflected back into the active region of the BAW resonator device 701.

Figure 7C:
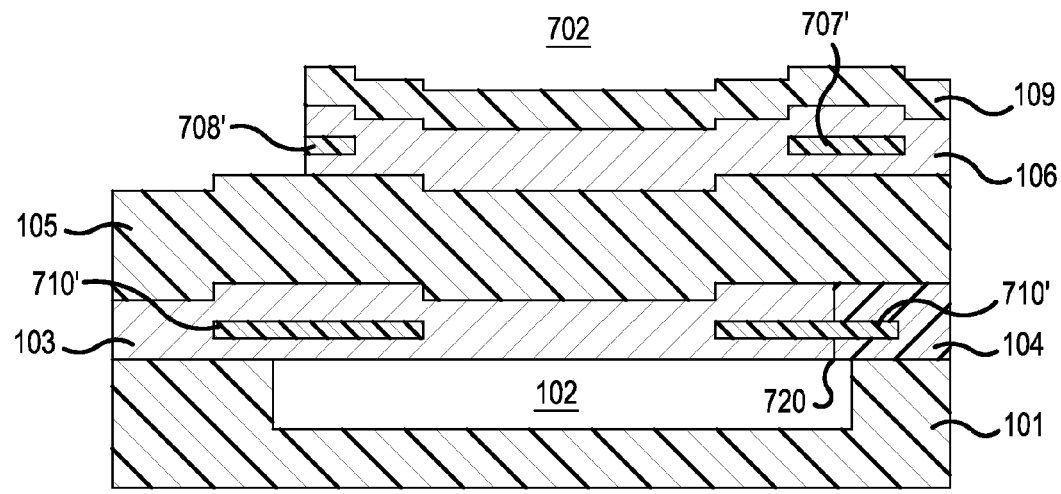

According to various embodiments, FIG. 7C is a cross-sectional view of BAW resonator device 702, which includes a ring, according to a representative embodiment. Many details of the BAW resonator device 702 are common to those of BAW resonator devices 100, 100', 200~203, 300~303, 400~403, 500~503, 600~603 and 700~701. Often, these details may not be repeated in order to avoid obscuring the description of the presently described representative embodiments.

Referring to FIG. 7C, illustrative BAW resonator device 702 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 702.

Although not shown in FIG. 7C, the BAW resonator device 702 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 702, reducing lost acoustic energy and improving the Q-factor of the BAW resonator device.

The second electrode 106 may be connected on connection side that comprises a filled first bridge 707' disposed along at least a portion of a perimeter along of an active region of the BAW resonator device 702. The second electrode also comprises a filled cantilevered portion 708'. The filled first bridge 707' and the filled cantilevered portion 708' are filled with a dielectric material, and is disposed along at least a portion of a perimeter along of an active region of the BAW resonator device 702. The filled first bridge 707' and the filled cantilevered portion 708' may be formed at a mid-point of the thickness of the second electrode 106, or elsewhere within the second electrode 106. The filled first bridge 707' and the filled cantilevered portion 708', in combination, may be referred to as a filled first ring.

BAW resonator device 702 comprises filled second bridge 710' disposed in the first electrode 103. The filled second bridge 710' may be formed at a mid-point of the thickness of the first electrode 103, or elsewhere within the first electrode 103. The filled second bridge 710' is filled with a dielectric material, and is disposed along at least a portion of a perimeter along of an active region of the BAW resonator device 702.

As depicted in FIG. 7C, the first electrode 103 terminates over the cavity 102 at a termination point 720, and the planarization layer 104 extends over the cavity 102 to abut the first electrode 103 at the termination point 720. As will be appreciated by one of ordinary skill in the art, if the first electrode terminated over the substrate 101, because the filled second bridge 710' is filled with dielectric material, acoustic waves would propagate through the filled second bridge 710' and into the substrate 101. Thus, the filled second bridge 710', would allow acoustic energy transfer into the substrate 101, where it would be lost, resulting in a reduced Q-factor. By contrast, because the first electrode 103 terminates over the air-filled cavity, an acoustic impedance discontinuity, acoustic energy is reflected back into the active region of the BAW resonator device 502.

Notably, inner edge of most inwardly extending portions of the filled first bridge 707', the filled cantilevered portion 708', and the filled second bridge 710' provide acoustic impedance discontinuities, in essence terminating the contacting overlap of the first electrode 103, the piezoelectric layer 105 and the second electrode 106, which defines the active region of the BAW resonator device 702. Notably, the dielectric material provided in the filled first bridge 707', the filled cantilevered portion 708', and the filled second bridge 710' has an acoustic impedance in order to provide significantly large lateral acoustic impedance discontinuity at the boundary of the active region of BAW resonator device 702. The mechanism of reducing losses in the filled first bridge 707', the filled cantilevered portion 708', and the filled second bridge 710' relies on suppression and confinement of the propagating eigenmodes, which are mechanically excited at the perimeter of the active region of the BAW resonator device 702 as a part of piston mode excitation. The filled first bridge 707', the filled cantilevered portion 708' and the filled second bridge 710' provide mechanical discontinuities to control the phase of the reflected mode and to provide overall beneficial suppression of the propagating eigenmodes in the active region.

The dielectric material used to fill the filled first bridge 707', the filled cantilevered portion 708', and the filled second bridge 710' is selected to survive etching steps used to form various features of the BAW resonator device 702, such as the cavity 102. Illustratively, the dielectric material used to fill the filled first bridge 707', the filled cantilevered portion 708', and the filled second bridge 710' comprises one of non-etchable borosilicate glass (NEBSG), carbon doped silicon dioxide (CDO), or silicon carbide (SiC).

Figure 7D:
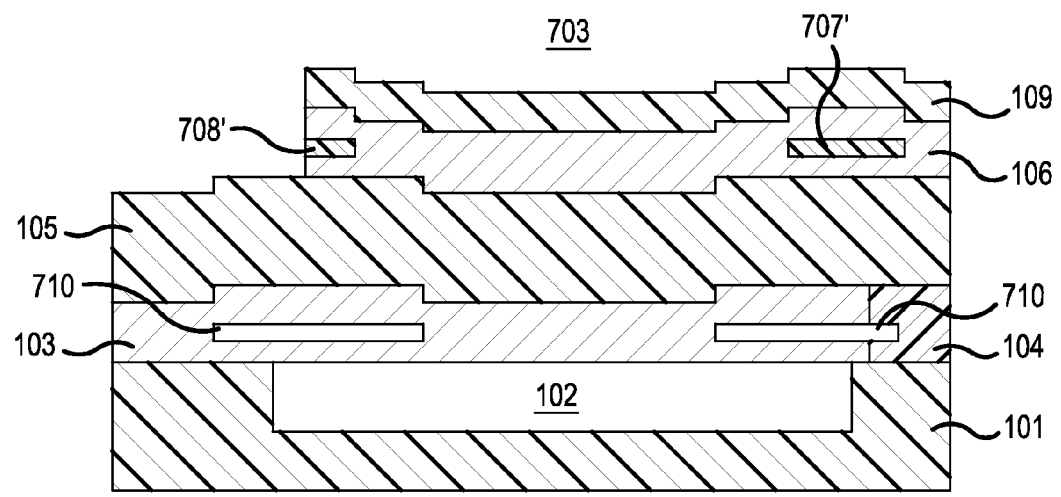

According to various embodiments, FIG. 7D is a cross-sectional view of BAW resonator device 503, which includes a ring, according to a representative embodiment. Many details of the BAW resonator device 502 are common to those of BAW resonator devices 100, 100', 200~203, 300~303, 400~403, 500~503, 600~603 and 700~702. Often, these details may not be repeated in order to avoid obscuring the description of the presently described representative embodiments.

Referring to FIG. 7D, illustrative BAW resonator device 703 includes acoustic stack formed over a substrate 101. In the depicted embodiment, the substrate 101 comprises a cavity 102 formed beneath an acoustic stack to provide acoustic isolation, such that the acoustic stack is suspended over an air space to enable mechanical movement and acoustic isolation. In alternative embodiments, the substrate 101 may be formed with no cavity, for example, with an acoustic stack may be formed over an acoustic reflector such as a Distributed Bragg Reflector (e.g., as depicted FIG. 1C), having alternating layers of high and low acoustic impedance materials, formed in the substrate 101.

Planarization layer 104 is provided over the substrate 101, beneath the piezoelectric layer 105, and abutting a termination of the first electrode 103.

The second electrode 106 is provided over the piezoelectric layer 105. The acoustic stack comprises first electrode 103, piezoelectric layer 105 and second electrode 106. As is known, a contacting overlap of the first electrode 103, the piezoelectric layer 105 and the second electrode 106 over the cavity 102 (or, as noted, other acoustic reflector such as a distributed Bragg reflector) forms the active region of the BAW resonator device 703.

Although not shown in FIG. 7D, the BAW resonator device 703 may also comprise recessed frame element (sometimes referred to as an "innie") and raised frame element (sometimes referred to as an "outie") provided in the second electrode 106. As is known, recessed frame element and raised frame element provide an acoustic impedance mismatch that serves to foster reflections of acoustic waves back into active region of the BAW resonator device 703, reducing lost acoustic energy and improving the Q-factor of the BAW resonator device.

The second electrode 106 may be connected on connection side that comprises filled first bridge 707'. The second electrode 106 also comprises the filled cantilevered portion 708' The filled first bridge 707' and the filled cantilevered portion 708', are filled with a dielectric material, and are disposed along at least a portion of a perimeter along of an active region of the BAW resonator device 703. The filled first bridge 707' and the filled cantilevered portion 708' may be formed at a mid-point of the thickness of the second electrode 106, or elsewhere within the second electrode 106. The filled first bridge 707' and the filled cantilevered portion 708', in combination, may be referred to as a filled first ring.

BAW resonator device 703 comprises second bridge 710 disposed in the first electrode 103. The second bridge 710 is filled with air, and is disposed along at least a portion of a perimeter along of an active region of the BAW resonator device 703. The second bridge 710 may be formed at a mid-point of the thickness of the first electrode 103, or elsewhere within the first electrode 103. The second bridge 710 may be referred to as a second ring.

Notably, inner edge of most inwardly extending portions of the filled first bridge 707', the filled cantilevered portion 708', and the second bridge 710 provide acoustic impedance discontinuities, in essence terminating the contacting overlap of the first electrode 103, the piezoelectric layer 105 and the second electrode 106, which defines the active region of the BAW resonator device 703. Notably, the dielectric material provided in the filled first bridge 707', the filled cantilevered portion 708', and the air provided in the second bridge 710 each have an acoustic impedance in order to provide significantly large lateral acoustic impedance discontinuity at the boundary of the active region of BAW resonator device 703. The mechanism of reducing losses in the filled first bridge 707', the filled cantilevered portion 708', and the second bridge 710 relies on suppression and confinement of the propagating eigenmodes which are mechanically excited at the perimeter of the active region of the BAW resonator device 703 as a part of piston mode excitation. The filled first bridge 707', the filled cantilevered portion 708', and the second bridge 710 provide mechanical discontinuities to control the phase of the reflected mode and to provide overall beneficial suppression of the propagating eigenmodes in the active region.

The dielectric material used to fill the filled first bridge 707' is selected to survive etching steps used to form various features of the BAW resonator device 703, such as the cavity 102, and second bridge 710. Illustratively, the dielectric material used to fill the filled first bridge 707' comprises one of non-etchable borosilicate glass (NEBSG), carbon doped silicon dioxide (CDO), or silicon carbide (SiC).

The various components, materials, structures and parameters are included by way of illustration and example only and not in any limiting sense. For example, materials used to filled bridges 207', 210', 307', 310', 407', 410', 507', 510', 607', 610', 707' and 710' in representative embodiments depicted in FIGS. 2A, 2B, 2C, 3B, 3C, 3D, 4B, 5B, 5C, 5D, 6B, 6C, 6D, 7B, 7C and 7D may be formed of metals without departing the scope of the present teachings. Illustrative metals include, but are not limited to Iridium (Ir), Tungsten (W), Molybdenum (Mo), Niobium (Nb), Ruthenium (Ru), Aluminum (Al) and Copper (Cu), and alloys thereof. Notably, of course, the selected metal or metal alloy selected as the "fill" material for the filled bridges 207', 210', 307', 310', 407', 410', 507', 510', 607', 610', 707' and 710' would be different than the material used for the electrode in which the bridge is provided. Also, various double-ring structures shown in FIGS. 1A through 7 may have inner edges aligned with each other, or may have the upper ring inner edge extending further into the active region of the acoustic resonator, or may have the lover ring inner edge extending further into the active region of the acoustic resonator as depicted for illustrative purposes in the present teachings. In view of this disclosure, those skilled in the art can implement the present teachings in determining their own applications and needed components, materials, structures and equipment to implement these applications, while remaining within the scope of the appended claims.

The invention claimed is:

1. A bulk acoustic wave (BAW) resonator device, comprising:
   a first electrode disposed over a substrate;
   a piezoelectric layer disposed over the first electrode;
   a second electrode disposed over the piezoelectric layer wherein the second electrode further comprises a raised frame element, or a recessed frame element, or both a raised frame element and a recessed frame element; and
   a passivation layer disposed over the second electrode, wherein a ring exists between the second electrode, and the passivation layer.

2. A BAW resonator device as claimed in claim 1, wherein the ring is a first ring, and the BAW resonator device further comprises a second ring.

3. A BAW resonator device as claimed in claim 2, wherein the first ring has a first width, the second ring has a second width, and the first width is less than the second width.

4. A BAW resonator device as claimed in claim 2, wherein the first ring, or the second ring, or both the first and second rings are filled with air.

5. A BAW resonator device as claimed in claim 2, the first ring, or the second ring, or both the first and second rings are filled with a dielectric material.

6. A BAW resonator device as claimed in claim 5, wherein the dielectric material comprises one of non-etchable borosilicate glass (NEBSG), carbon doped silicon dioxide (CDO), or silicon carbide (SiC).

7. A BAW resonator device as claimed in claim 1, wherein the first ring, or the second ring, or both the first and second rings, are filled with a metal or a metal alloy.

8. BAW resonator device as claimed in claim 7, wherein the metal comprises one or more of Iridium (Ir), Tungsten (W), Molybdenum (Mo), Niobium (Nb), Ruthenium (Ru), Aluminum (Al), and Cooper (Cu).

9. A bulk acoustic wave (BAW) resonator device, comprising:
   a first electrode disposed over a substrate;
   a piezoelectric layer disposed over the first electrode;
   a second electrode disposed over the piezoelectric layer; and
   a passivation layer disposed over the second electrode, wherein a first ring exists between the second electrode and the passivation layer, and a second ring exists in the piezoelectric layer and along at least a portion of an active region of the BAW resonator device.

10. A BAW resonator device as claimed in claim 9, wherein the first ring, or the second ring, or both the first and second rings are filled with air.

11. A BAW resonator device as claimed in claim 9, wherein the first ring, or the second ring, or both the first and second rings are filled with a dielectric material.

12. A BAW resonator device as claimed in claim 11, wherein the dielectric material comprises one of non-etchable borosilicate glass (NEBSG), carbon doped silicon dioxide (CDO), or silicon carbide (SiC).

13. A BAW resonator device as claimed in claim 9, wherein the first ring, or the second ring, or both the first and second rings, are filled with a metal or a metal alloy.

14. BAW resonator device as claimed in claim 13, wherein the metal comprises one or more of Iridium (Ir), Tungsten (W), Molybdenum (Mo), Niobium (Nb), Ruthenium (Ru), Aluminum (Al), and Cooper (Cu).

* * * * *